United States Patent
Brown et al.

[19]

[11] Patent Number: 6,116,566
[45] Date of Patent: Sep. 12, 2000

[54] PROCESSOR SUPPORT BRACKET WITH SNAP MOUNTING FEATURE

[75] Inventors: Joseph W. Brown, Mansfield; William H. Harwell, Arlington; Jon E. Devine, Keller, all of Tex.

[73] Assignee: Central Industrial Supply Company, Inc., Grand Prairie, Tex.

[21] Appl. No.: 09/362,940

[22] Filed: Jul. 28, 1999

Related U.S. Application Data

[63] Continuation-in-part of application No. 09/008,908, Jan. 20, 1998.

[51] Int. Cl.[7] .................................................. A47G 29/00
[52] U.S. Cl. ......................... 248/694; 361/740; 361/754; 361/759
[58] Field of Search ............................... 248/346.01, 694; 211/41.1, 41.17, 4, 41; 361/740, 754, 759, 157, 796, 798, 749, 756, 801, 752, 802, 732, 730, 807, 809, 810, 704; 439/154, 157, 328, 64, 377; 174/250; 411/45–48

[56] References Cited

U.S. PATENT DOCUMENTS

| | | | |
|---|---|---|---|
| 5,201,623 | 4/1993 | Benedetti | 411/48 |
| 5,285,353 | 2/1994 | Buck | 361/732 |
| 5,535,100 | 7/1996 | Lubahn | 361/801 |
| 5,568,364 | 10/1996 | Madden | 361/752 |
| 5,642,263 | 6/1997 | Lauruhn | 361/801 |
| 5,761,036 | 6/1998 | Hopfer | 361/704 |
| 5,829,601 | 11/1998 | Yurchenco | 211/41.17 |
| 5,846,039 | 12/1998 | Kirchen | 411/34 |

*Primary Examiner*—Ramon O. Ramirez
*Assistant Examiner*—Gwendolyn Baxter
*Attorney, Agent, or Firm*—Gregory M. Howison; Mark W. Handley; Stephen S. Mosher

[57] ABSTRACT

A processor support bracket is provided for mounting a processor cartridge package to a surface of a system baseboard of a personal computer. The processor support bracket includes a mounting section which is mounted to the baseboard to secure the cartridge package to the system baseboard. An end of the mounting section which is disposed adjacent to the surface of the baseboard has two spaced apart apertures which extend therethrough, transverse to the surface of the baseboard. Two slots are formed into the end of said mounting section and extend transverse to the apertures. The slots intersect the respective ones of the apertures and have widths for passing fasteners through the slots and into respective ones of the apertures for securing the mounting section to the system baseboard. The slots have profiles which define shoulders that extend transverse to respective ones of the apertures, with a respective pair of the shoulders spaced apart and facing in opposite directions adjacent to the respective ones of the apertures. The fasteners having protuberances which extend from the fasteners to define annular-shaped ribs which fit flush with the spaced apart shoulders, and between respective pairs of the spaced apart shoulders, such that the respective fasteners are retained from moving from the aperture in a direction which is transverse to the slot.

19 Claims, 15 Drawing Sheets

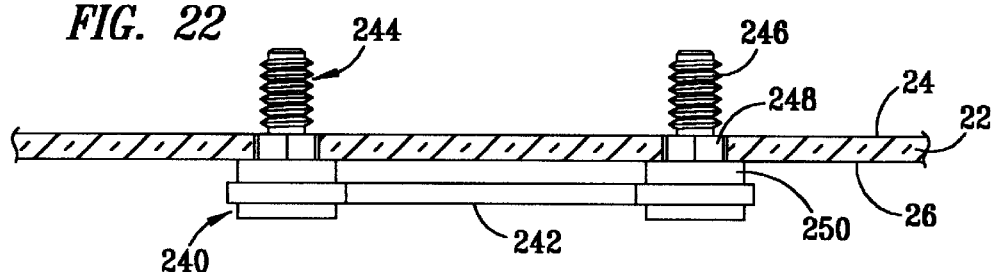
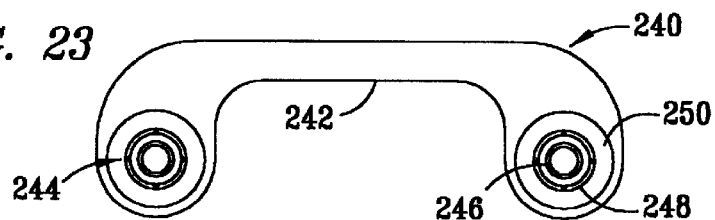
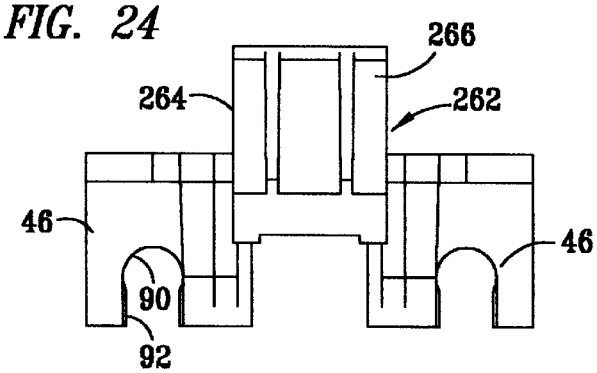
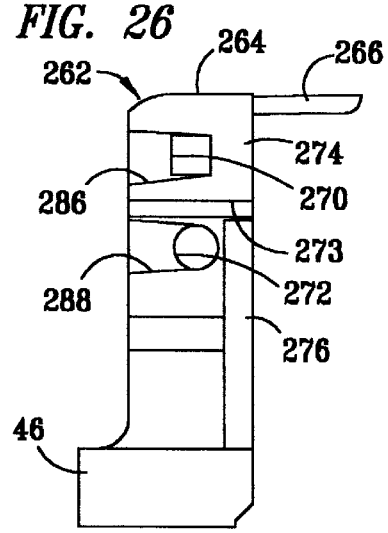
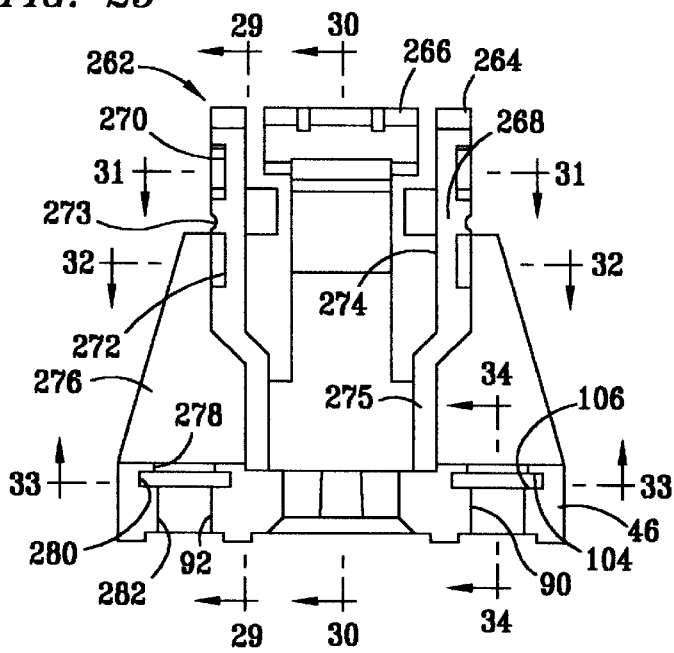

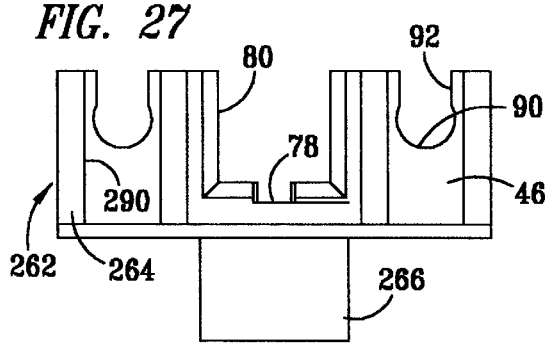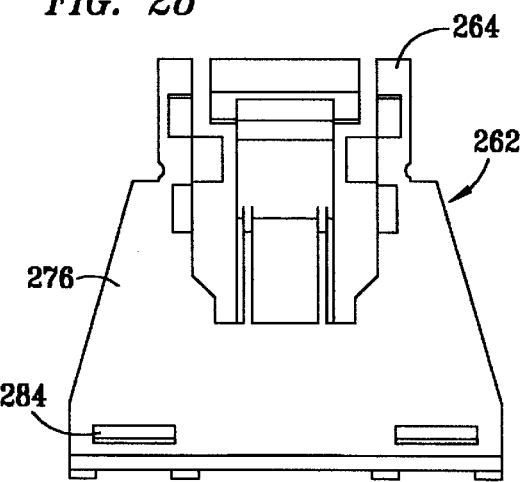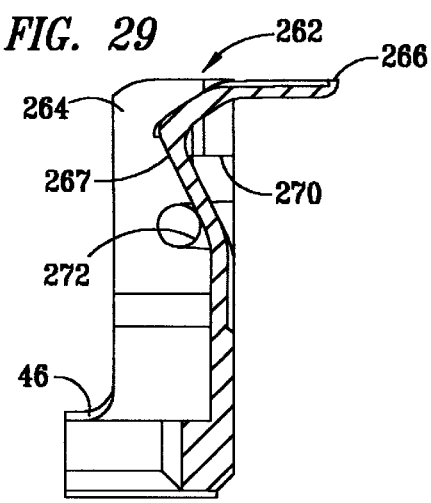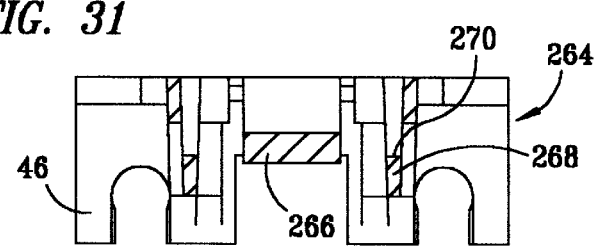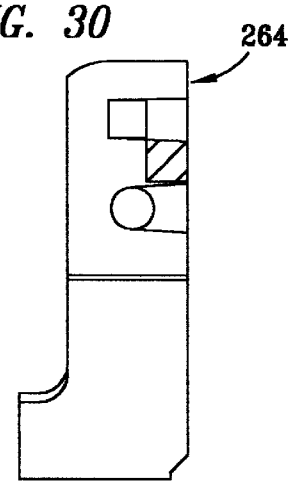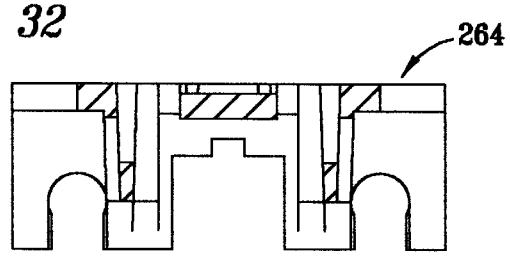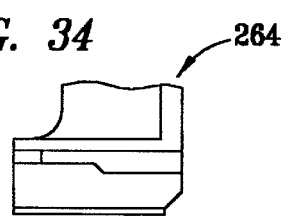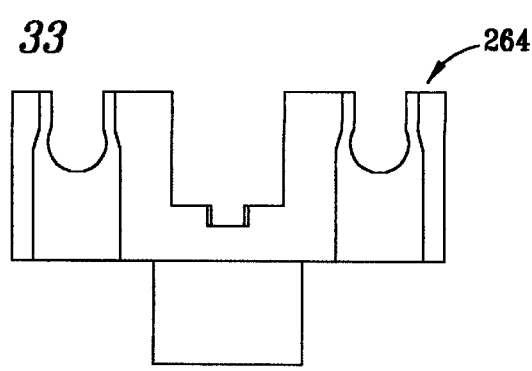

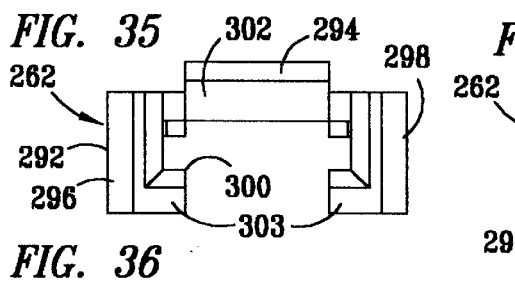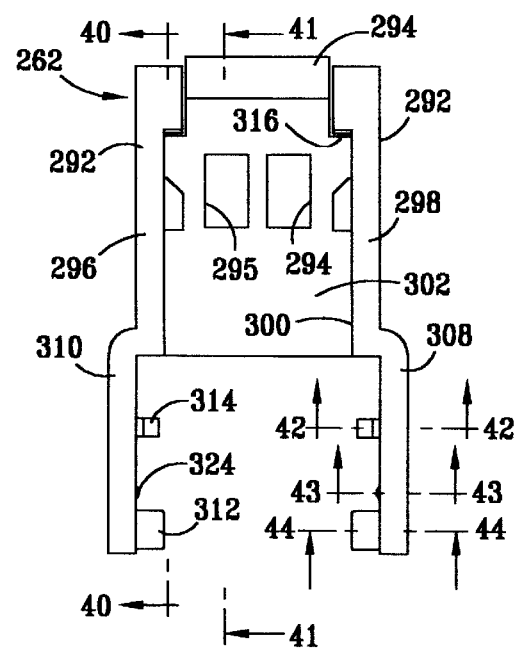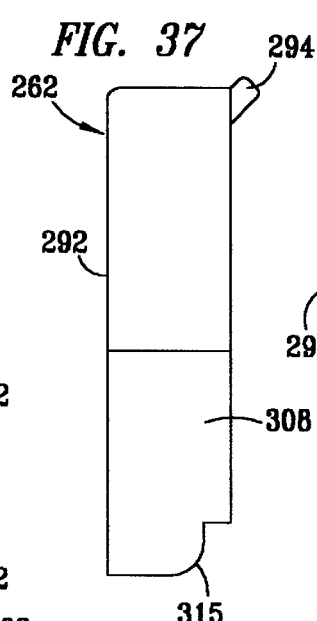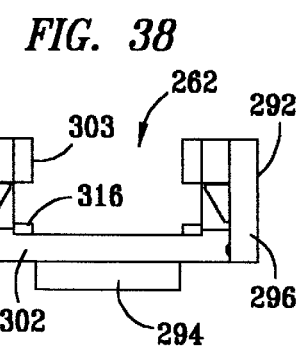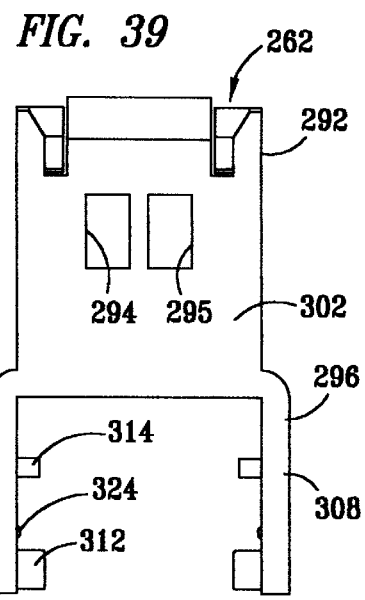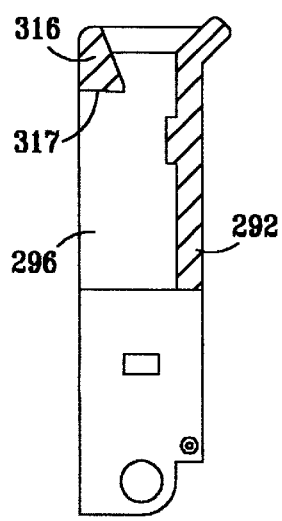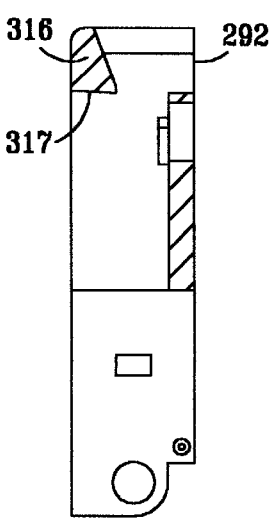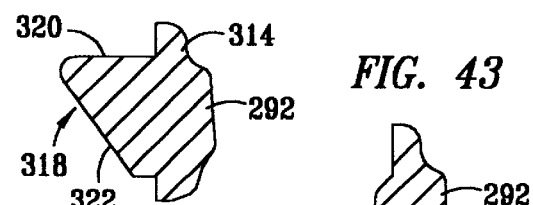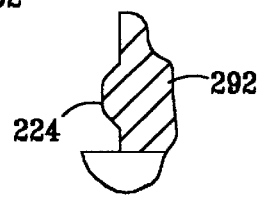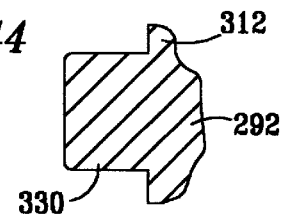

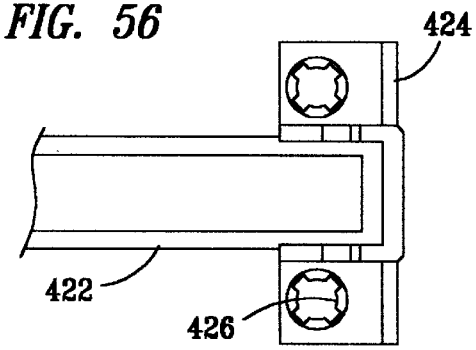
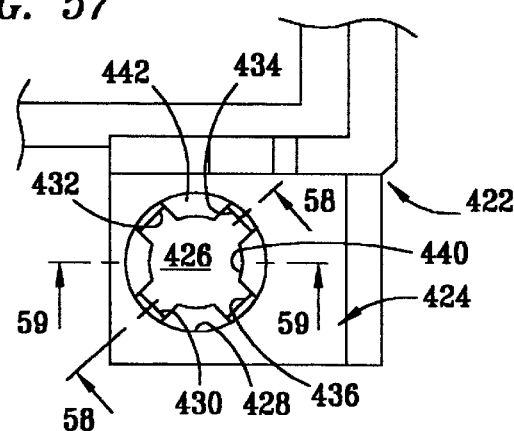
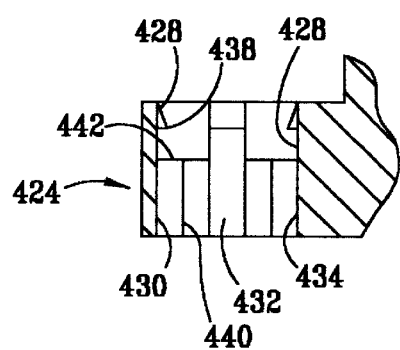
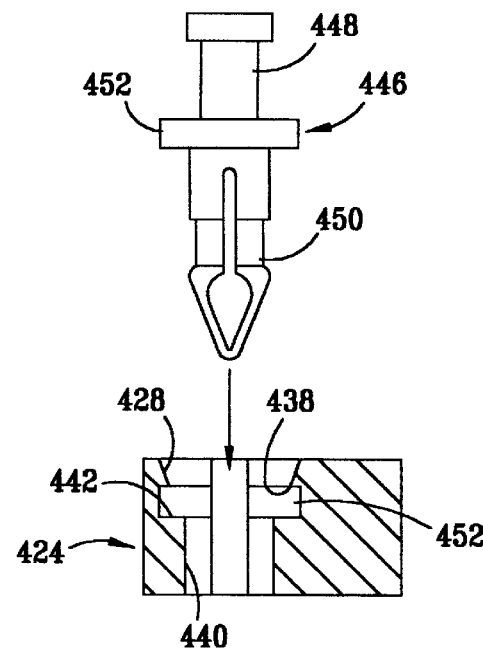
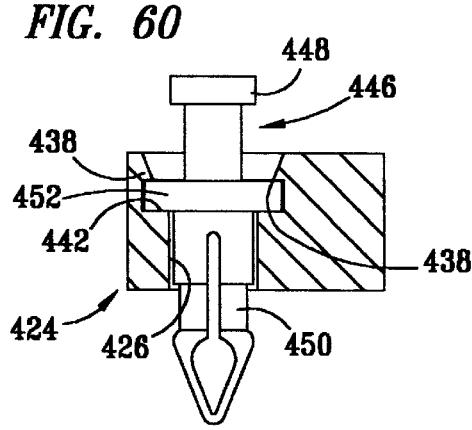
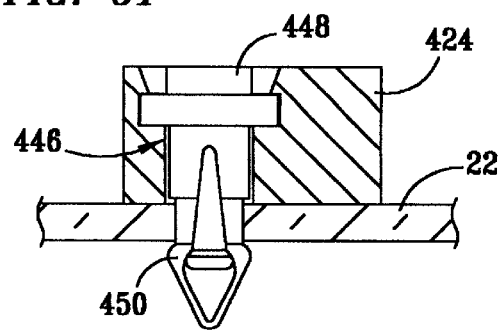

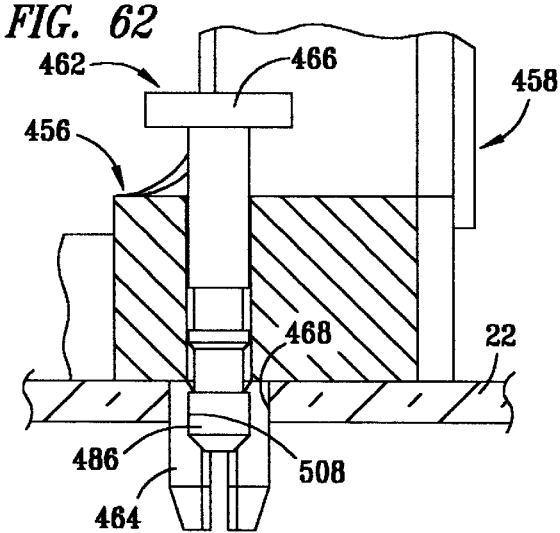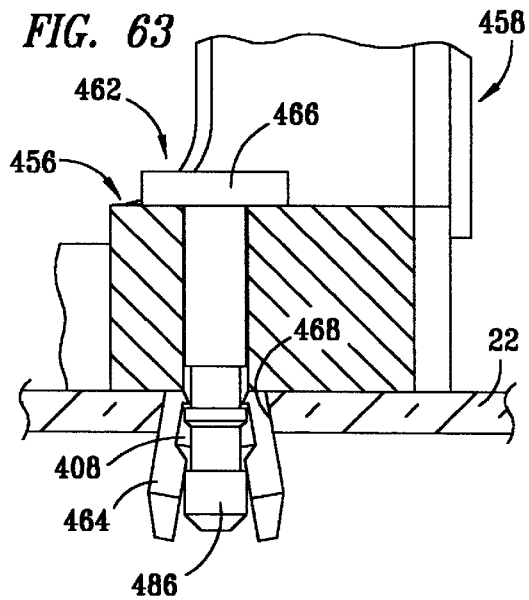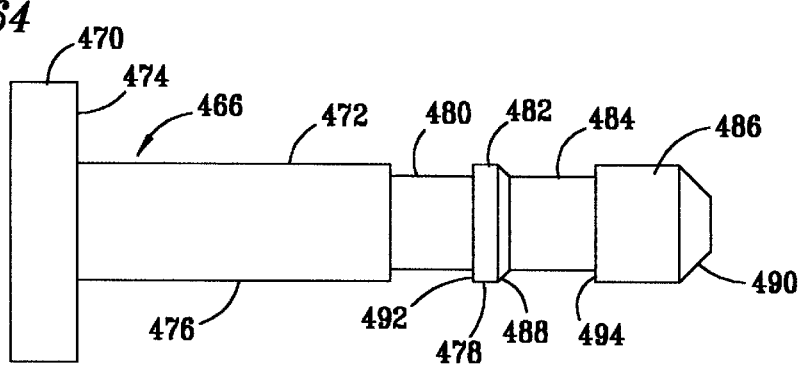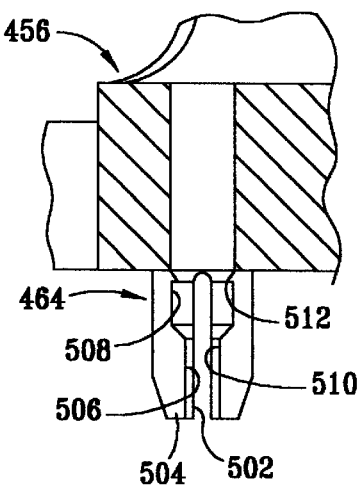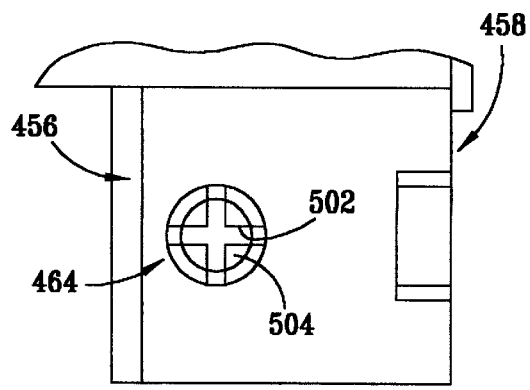

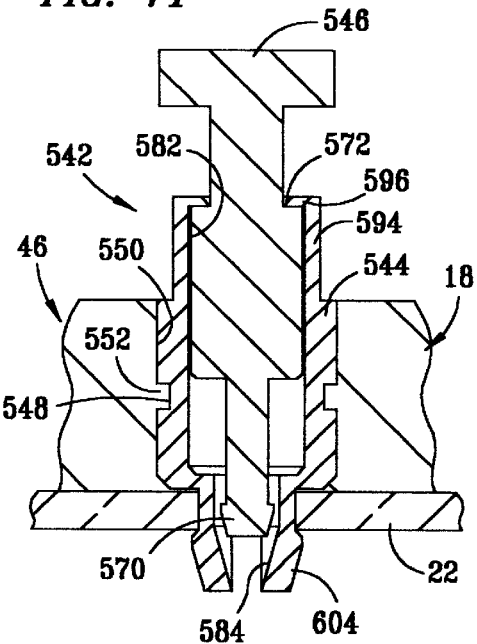
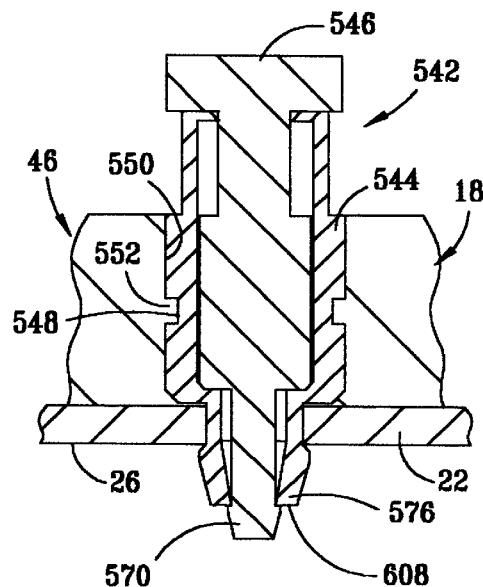
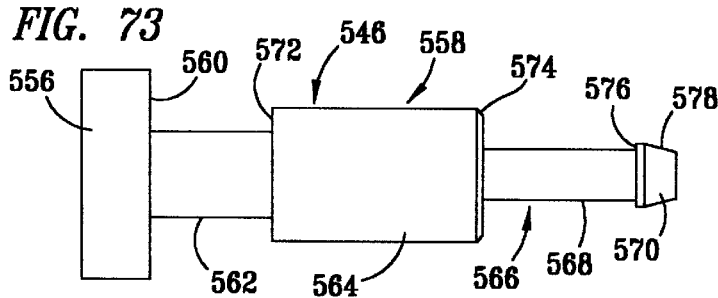
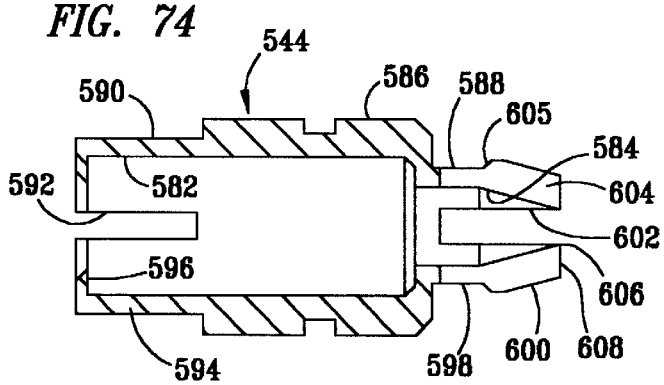
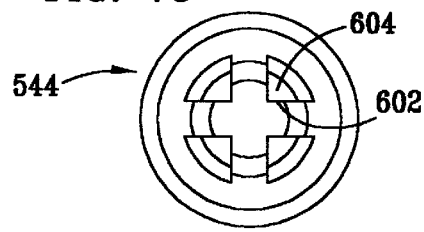
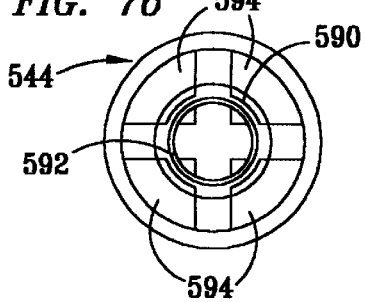

PROCESSOR SUPPORT BRACKET WITH SNAP MOUNTING FEATURE

CROSS REFERENCE TO RELATED APPLICATION

This application is a continuation-in-part of Ser. No. 09/008,908, filed Jan. 20, 1998 and entitled "Processor Support With Snap Mounting Feature."

TECHNICAL FIELD OF THE INVENTION

The present invention is related to support brackets for mounting electronic components of computer hardware, and in particular is directed toward a processor support mounting bracket for use in a personal computer.

BACKGROUND OF THE INVENTION

Prior art processors for personal computers have been mounted to baseboards, commonly called motherboards, using processor plug-in sockets which have pin and socket type electrical contacts which extend in a single planar region located beneath particular ones of the processors, such as zero-force insertion sockets. However, such planer, plug-in type processor sockets have a limited number of electrical contacts, as determined by the minimum spacing requirements between the contacts and the size of the space disposed in the planar region located beneath the processor. Further developments in processor technology have resulted in the need for an increased number of electrical contacts for providing multiple processing paths and database connections. Such advances in processor architecture should continue to increase the number of external electrical contacts required for processor operation than that which may be provided by conventional planer, plug-in type processor sockets. For example, present conventional processor architecture incorporates into a singular processor package a processor core and several auxiliary processing devices, such as TAGRAM, SRAM and MMX type multimedia technology processing components. Packaging of the processor core and the auxiliary processing devices into a singular package also results in an increase in the number of contacts required to electrically connect the processor to a system baseboard.

One current trend in processor packaging technology has resulted in use of single edge contact cartridge packages for housing a processor core and several auxiliary processing devices, such as SRAM, TAGRAM, and MMX processor devices. The processor core and the auxiliary processing devices are individually mounted directly to the surface of a planar substrate which is enclosed within the single edge contact cartridge package. Traces in the substrate interconnect the processor core and the auxiliary processing devices and connect to edge contacts of the single edge cartridge package. These single edge cartridge packages are currently being provided with two planar, oppositely facing surfaces, which extend parallel to the planar surface of the substrate to which the processor core and the auxiliary processing devices are mounted. Typically, the single edge cartridge packages include four end-edge surfaces which extend between the two planar, oppositely facing surfaces, perpendicular to the two surfaces and perpendicular to adjacent ones of the end-edge surfaces. Surface type, edge contacts are arranged into two double rows of contacts which extend adjacent to a single one of the edge-end surfaces, with each of the double rows of contacts extending on opposite facing sides of the package from the other of the double rows. The edge contacts are configured for engaging within corresponding contacts of a slot connector mounted to a system baseboard. Typically, the single edge contact cartridge packages are being mounted such that the end-edge surface which is adjacent to the contacts extends parallel to the major plane of a system baseboard in which the processor package is used, and the two planar surfaces extend perpendicular to the major plane of the baseboard.

Single edge contact processor cartridge packages have been mounted to system baseboards utilizing prior art support brackets which have upwardly extending, oppositely facing channels for receiving two oppositely disposed ones of the end-edges of the single edge contact cartridge packages which are adjacent to the single end-edge on which the processor cartridge package contacts are disposed. These prior art support brackets have been mounted to the baseboards utilizing threaded connectors, by passing threaded studs from underneath the baseboards and through corresponding mounting holes in the baseboards to extend above the top planar surfaces of the baseboards, and then threadingly engaging the studs with nuts. This type of securement method is rather cumbersome, requiring access to both sides of the baseboards to be able to mount the support brackets for the single edge contact cartridge packages.

SUMMARY OF THE INVENTION

The present invention as disclosed and claimed herein is directed towards a processor support bracket for mounting a processor cartridge package to a surface of a system baseboard of a personal computer. The processor support bracket includes a mounting section which is mounted to the baseboard to secure the cartridge package to the baseboard. An end of the mounting section which is disposed adjacent to the surface of the baseboard has two spaced apart apertures which extend therethrough, transverse to the surface of the baseboard. Two slots are formed into the end of said mounting section and extend transverse to the apertures. The slots intersect the respective ones of the apertures and have widths for passing fasteners through the slots and into respective ones of the apertures for securing the mounting section to the system baseboard. The slots have profiles which define shoulders that extend transverse to respective ones of the apertures, with a respective pair of the shoulders spaced apart and facing in opposite directions adjacent to the respective ones of the apertures. The fasteners having protuberances which extend from the fasteners to define annular-shaped ribs which fit flush between respective pairs of the spaced apart shoulders, such that the respective fasteners are retained from moving from the aperture in a direction which is transverse to the slot.

In another aspect of the present invention, a processor support bracket is provided for mounting a single edge contact cartridge package to a system baseboard. The support bracket in one embodiment includes two separate channel member mounting sections which extend upward from the baseboard, with the longitudinal openings of the channel members aligned to face one another for receiving two oppositely disposed edges of a single edge contact cartridge package. The edge contacts of the single edge contact cartridge package extend between the two channel sections and engage the slot connector mounted to the baseboard between the two channel sections. The processor support bracket has mounting ears which extend to define opposite corners of the support bracket, two on each channel section. The four mounting ears are configured for mounting flush against the baseboard, and each have apertures which extend through the thicknesses thereof. The apertures in the mounting ears are located to align with mounting holes in the baseboard. Each of the mounting ears have an intermediate slot which extends into a main body portion of the mounting ears, transverse to respective ones of the apertures, to define an upper ledge and a lower ledge within respective ones of the mounting ears.

BRIEF DESCRIPTION OF THE DRAWINGS

For a more complete understanding of the present invention and the advantages thereof, reference is now made to the following description taken in conjunction with the accompanying Drawings in which like components are referred to with like reference numerals, and in which:

FIG. 22 illustrates a partial sectional view of a baseboard and a mounting adapter for use with the fastener of FIG. 20, taken along a vertical sectioning plane, after the mounting adapter has been mounted to the baseboard;

FIG. 23 illustrates a top view of the mounting adapter of FIG. 23;

FIG. 24 illustrates a top view of a base of an alternative mounting bracket;

FIG. 25 illustrates a front view of the base of the mounting bracket;

FIG. 26 illustrates a right-side view of the base of the mounting bracket;

FIG. 27 illustrates a bottom view of the base of the mounting bracket;

FIG. 28 illustrates an elevational view of a rearward side, or an outward end, of the base of the mounting bracket;

FIGS. 29 through 34 illustrate various sectional views of the base of the mounting bracket, taken along various sectioning planes set forth in FIG. 25;

FIG. 35 illustrates a top view of an upper member of the mounting bracket;

FIG. 36 illustrates a frontal, elevation view of the upper member of the mounting bracket;

FIGS. 37, 38 and 39 illustrate a side view, a bottom view and a rear view, respectively, of the upper member of the mounting bracket;

FIGS. 40 through 44 illustrate various sectional views of the upper portion of the mounting bracket, taken along the sectioning planes set forth in FIG. 36;

FIG. 56 illustrates a partial top view of a processor support bracket having an alternative mounting ear which includes a mounting hole for receiving a one-piece plastic fastener to mount the processor support bracket to a baseboard;

FIG. 57 illustrates an enlarged view of one of the mounting ears of the processor support bracket of FIG. 56;

FIG. 58 illustrates a partial sectional view of the mounting ear of the processor support bracket, taken along section line 58—58 of FIG. 57;

FIG. 59 illustrates a sectional view of the mounting ear of the processor support bracket, taken along section line 59—59 of FIG. 57, and depicts a one-piece plastic fastener being inserted within the mounting ear;

FIG. 60 illustrates a sectional view of the mounting ear of the processor support bracket, taken along section line 59—59 of FIG. 57, and depicts the one-piece plastic fastener after being inserted within the mounting ear, with the pin of the one-piece plastic fastener in an upwards position;

FIG. 61 illustrates a sectional view of the mounting ear of the processor support bracket of FIG. 57, taken along section line 59—59 of FIG. 57, and depicts the one-piece plastic fastener after the fastener has been mounted within the mounting ear and the pin has been pushed into a downward position to secure the mounting ear to the baseboard;

FIGS. 62 and 63 illustrate partial section views of a mounting ear of a processor support bracket having an integrally molded collet, shown in released and latched positions, respectively;

FIG. 64 illustrates a side view of the pin;

FIG. 65 illustrates a sectional view of the mounting ear and a the collet portion which extends downward from the lower surface of the mounting ear;

FIG. 66 illustrates a bottom view of the mounting ear and the integrally molded collet formed therein;

FIGS. 71 and 72 illustrate a sectional view of a mounting ear and a fastening assembly for securing a processor support bracket to a system baseboard, shown in released and latched positions, respectively;

FIG. 73 illustrates a side view of the pin;

FIG. 74 illustrates a longitudinal section view of the collet;

FIG. 75 illustrates a bottom view of the collet; and

FIG. 76 illustrates a top view of the collet.

DETAILED DESCRIPTION OF THE INVENTION

Figure 1:
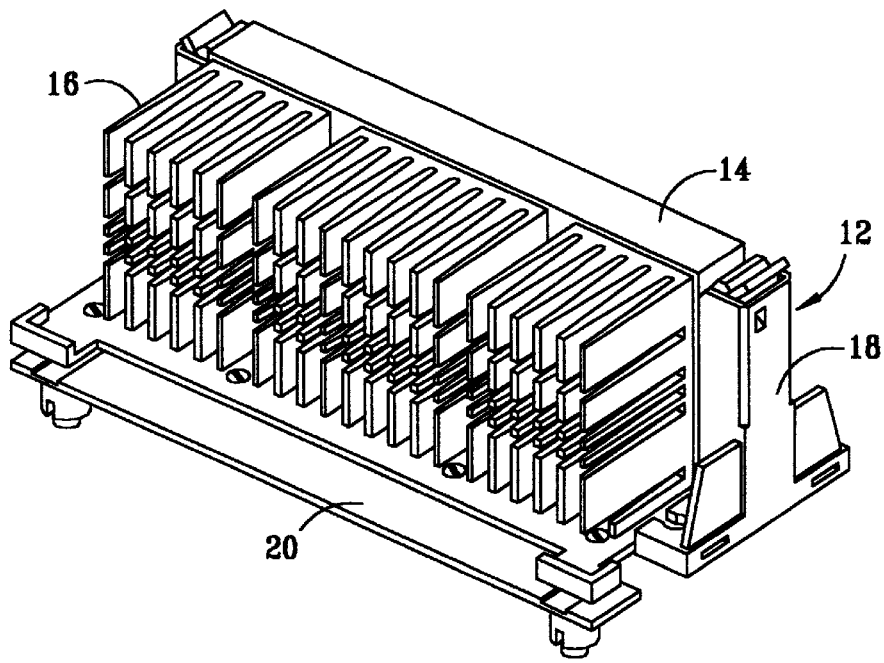
FIG. 1 illustrates a perspective view of a processor assembly having a single edge contact cartridge package with a heat sink and mounting brackets which are secured to the cartridge package and the heat sink.

Referring now to FIG. 1, there is illustrated a perspective view of a processor assembly 12. The processor assembly 12 includes a single edge contact cartridge package 14 with a heat sink 16 mounted thereto. A processor support bracket 18 is provided for rigidly securing to the single edge contact cartridge package 14 and a heat sink support bracket 20 is fastened to the heat sink 16. The single edge contact cartridge package 14 has a major plane, defined herein as being the plane of the cartridge package 14 having a significantly larger surface area than the end-edge surfaces, and extending perpendicular to the edge-end surfaces.

Figure 2:
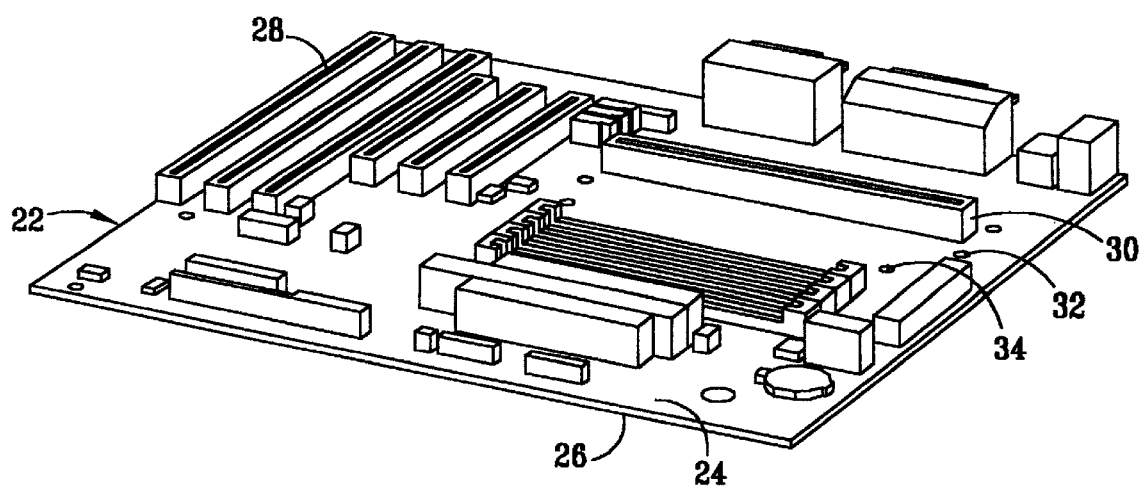
FIG. 2 illustrates a perspective view of a baseboard having mounting holes and a slot connecter for mounting the processor assembly to the baseboard.

Referring now to FIG. 2, there is illustrated a perspective view of a baseboard 22, prior to mounting the processor assembly 12 to the baseboard 22. The baseboard 22 includes an upper planar surface 24 and a lower planar surface 26. A plurality of component connectors 28 are mounted to the baseboard 22, fitting flush with the upper planar surface 24. A slot connector 30 is mounted to the upper planar surface 24, and is of the type for electrically connecting the single edge contact cartridge package 14 of FIG. 1 to the baseboard 22. Four support bracket mounting holes 32 (three shown) extend through the baseboard 22 and are spaced apart in proximity to the slot connector 30, on opposite ends and opposite sides of the slot connector 30. Two heat sink support mounting holes 34 extend through the baseboard 22, spaced apart along a singular side of the slot connector 30.

Figure 3:
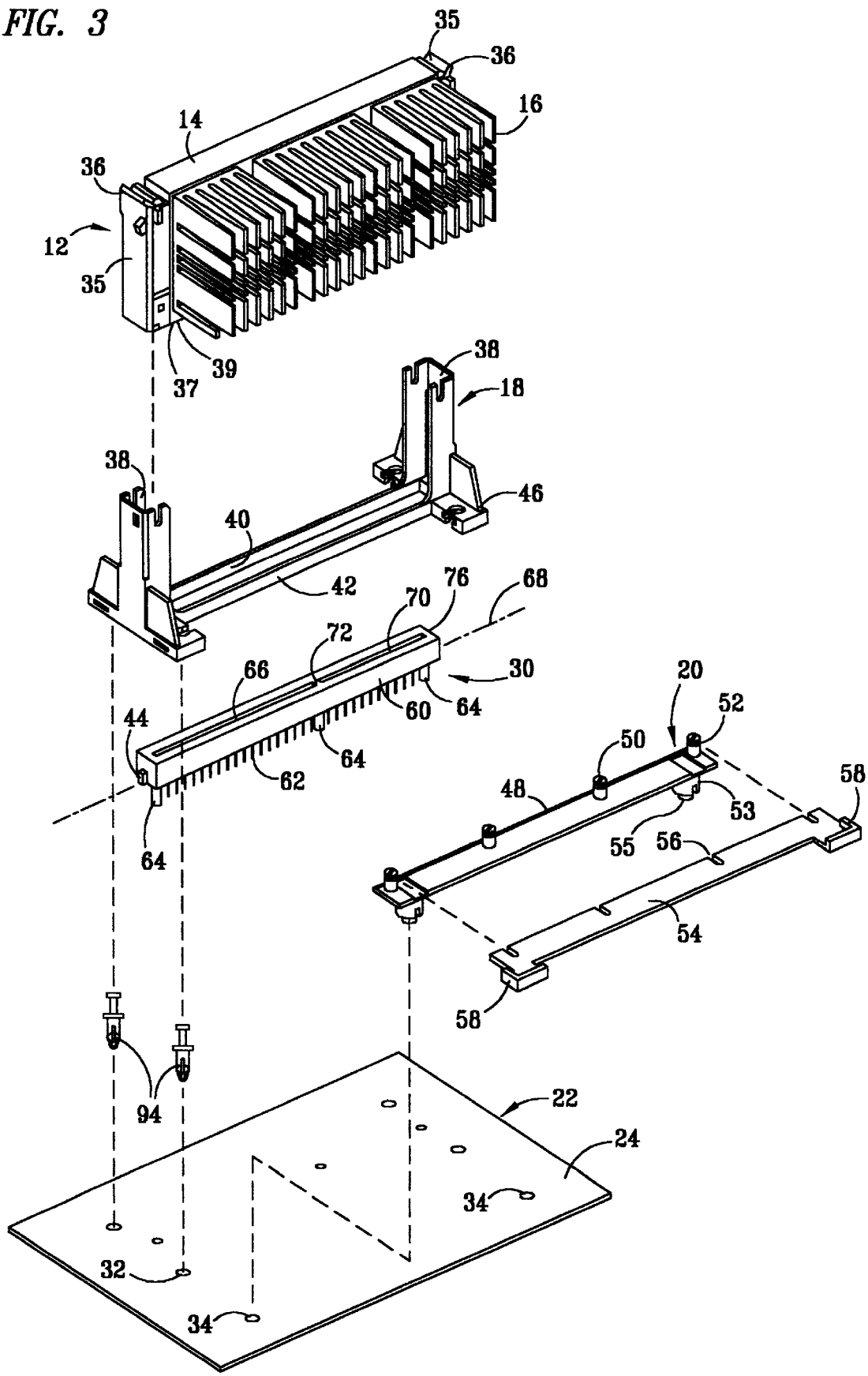
FIG. 3 illustrates an exploded view of the processor assembly and the baseboard.

Referring now to FIG. 3, there is illustrated an exploded view of the processor assembly 12 and the baseboard 22, indicating assembly of various components therefor. The processor assembly 12 includes the single edge contact cartridge package 14 and the heat sink 16. The processor cartridge contact package 14 has side end-edge surfaces 35 and side electrical contacts 37 adjacent to edge-end surface 39. Latch mechanisms 36 are provided on opposite edges of the single edge contact cartridge package 14 for engaging within longitudinally extending openings of channel sections 38 of the processor support bracket 18. The channel sections 38 define mounting sections for mounting to the baseboard 22 and securing to the side end-edge surfaces 35 of the cartridge package 14. The channel sections 38 are secured to the baseboard such that longitudinal lengths of the channel sections 38 extend transverse to the surface 24 of the baseboard 22. The processor support bracket 18 further includes a slot 40 which extends within a connecting member 42 for interiorly receiving the slot connector 30. The connecting member 42 extends between the two channel sections 38 of the processor support bracket 18. A protuberance 44 laterally extends from the side of the slot connector 30 to provide a key for engaging within the slot 40. Four rivets 94 (two shown) engage the mounting ears 46 of the processor support bracket 18 in a snap mounting engagement and extend through the mounting holes 32 in the baseboard 22 to secure the processor support bracket to the baseboard 22.

The slot connector 30 has a main body portion 60 from which contact pins 62 extend downwardly therefrom. Three mounting pins 64 extend downward from the body portion 60 of the slot connector 30. Two of the mounting pins 64 extend downward from opposite ends, with one being adjacent to the protuberance 44. A slot 66 extends longitudinally along a center line 68 of the main body portion 60 of the slot connector 30. Electrical contacts 70 extend along opposite sides of the centerline 68 and the slot 66, for electrically engaging the edge electrical contacts 37 of the single edge contact cartridge package. The contact edge 39 of the single edge contact cartridge package 14 is inserted within the slot 66. A key member 72 is disposed in an intermediate portion of the slot 66 for ensuring that the lowermost edge of the single edge contact cartridge package 14 must be properly aligned to be inserted within the slot 66.

The heat sink support bracket 20 comprises a base 48 having lugs 50 which extend upwardly therefrom. The lugs 50 have annularly extending grooves 52 which extend circumferentially around an upper end of the lugs 50. The heat sink support bracket 20 further includes a mounting bar 54. The mounting bar 54 has laterally extending slots 56 which are sized for engaging within the grooves 52 of the lugs 50. Two latches 58 are provided for latching the mounting bar 54 to the base 48, with the slots 56 interlocked within the grooves 52 of the lugs 50. The base 48 of the heat sink support bracket 20 also includes collets 53 and pins 55. The slotted mounting collets 53 extend downward from the base 48 for engaging within the heat sink support mounting holes 34 of the baseboard 22 (shown in FIG. 2). The slotted collets 53 are passed through the mounting holes 34 of the baseboard 22, and then the pins 55 are passed through the center of the collets 53 such that the collets 53 are expanded into the sides of the mounting holes 34 to retain the base 48 in a position rigidly mounted to the upper surface 24 of the baseboard 22. The pins 55 are inserted within the slotted collets 53 of the mounting bar 54 and the base 48. Then, the mounting bar 54 is installed upon the base 48 such that the slots 56 of the mounting bar 54 engage the grooves 52 of the lugs 50, and the latches 58 engage the outermost lugs 50 to secure the mounting bar 54 atop the base 48, and to retain the pins 55 within the slotted collets 53.

Figure 4:
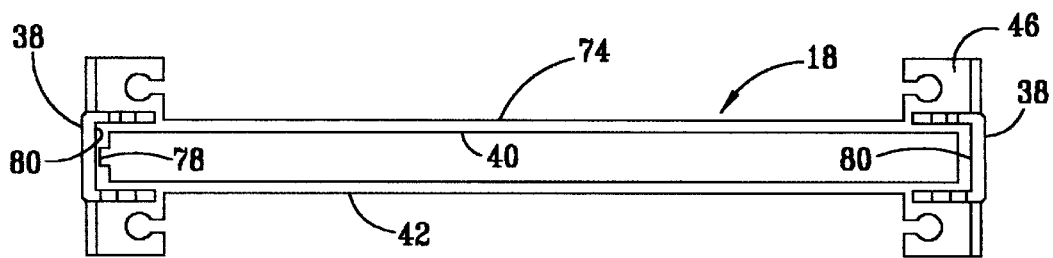
FIG. 4 illustrates a top view of the processor support bracket.

Referring now to FIG. 4, there is illustrated a top view of the processor support bracket 18. A footprint 74 of the processor support bracket 18 extends symmetrically about a peripheral outline 76 of the slot connector 30 (shown in FIG. 3). The footprint 74 further defines the slot 40 of the processor support bracket 18 which will slidingly engage the peripheral outline 76 of the slot connector 30. A key tab slot 78 extends on one end of the slot 40 of the footprint 74 of the processor support bracket 18 for engaging the protuberance 44 of the slot connector 30. The slot 78 provides a key way for receiving the protuberance 44 such that the processor support bracket 18 must be properly aligned with the slot connector 30 when they are mounted to the planar surface 24 of the baseboard 22 (shown in FIG. 3). The channel sections 38 have longitudinally extending openings which face one another, and interior profiles 80 which are shaped, when a cross-section of the channels 38 is taken in a horizontal plane, such that they have angled surfaces for mating with the edges of the single edge contact cartridge package 14, such that the single edge contact cartridge package 14 can only be inserted into the channel sections 38 when properly aligned with the channel sections 38. Thus, the edges 35 of the single edge contact cartridge package 14 (shown in FIG. 3) are shaped to extend at an angle other than ninety degrees to the major plane of the package 14, such that they are keyed with the interior profiles 80 of the channel sections 38. The edges 35 of the single edge contact cartridge package 14 are aligned with the profiles 80 of the channel sections 38, such that edges 35 will slide downward within the profiles 80 of the channel sections 38 and the edge contacts 37 will engage within the slot 66 of the slot connector 30. This will also align the protuberance 44 of the slot connector 30 for fitting within the slot 78 of the processor support bracket 18, and thus the slot connector 30 and the processor support bracket 18 are oriented with respect to one another.

Figure 5:
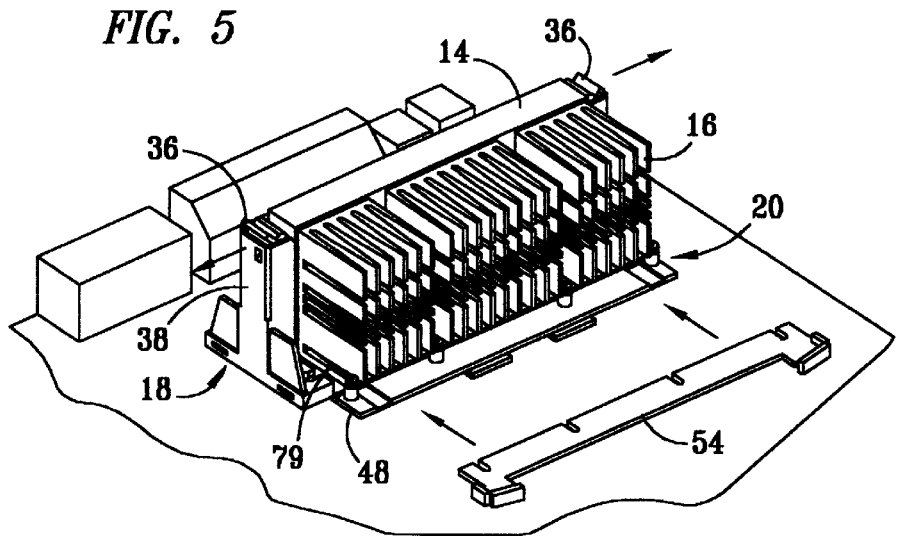
FIG. 5 illustrates the single edge contact cartridge package after installation into the processor support bracket and onto baseboard.

Referring now to FIG. 5, there is illustrated the single edge contact cartridge package 14 after installation into the processor support bracket 18. The processor support bracket 18 is secured to the baseboard 22. The latches 36 are moved outward to engage the channel sections 38, which latches the single edge contact cartridge package 14 within the processor support bracket 18. Then, the heat sink 16 is secured to the baseboard 22 by moving the mounting bar 54 to engage the base 48 and to supportingly engage within a longitudinal slot 79 formed into the lower portion of the fins of the heat sink 16.

Figure 6:
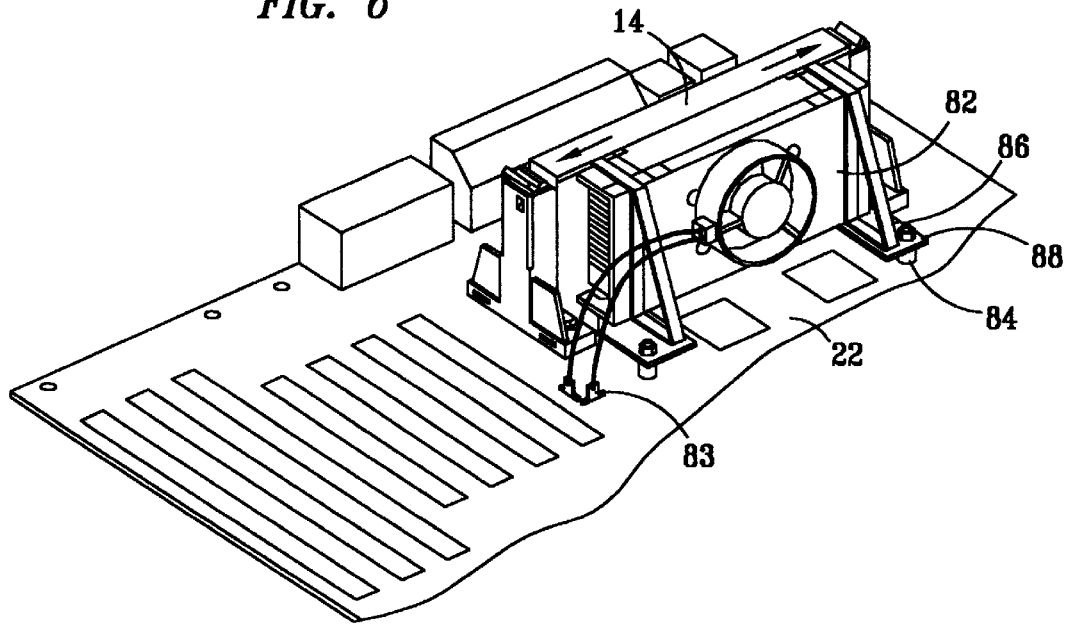
FIG. 6 illustrates a single edge contact cartridge package with a processor cooling fan mounted thereto.

Referring now to FIG. 6, there is illustrated a single edge contact cartridge package 14 with a cooling fan 82 mounted thereto. Power connection 83 is provided for powering the cooling fan 82. Two studs 84 extend upward from the baseboard 22 for engaging a mounting foot 88 of a bracket for the cooling fan 82. A slide latch 86 secures the cooling fan 82 to the studs 84 and the baseboard 22.

Referring to FIGS. 1 through 5, in the method of assembly of the present invention, a slot connector 30 is mounted to a baseboard 22. Then, six mounting holes 32, 34 are provided in the baseboard 22. Four of the mounting holes 32 are used for securing a processor support bracket 18 to the baseboard 22. Two of the mounting holes 34 are used for securing the heat sink mounting holes 34 and the heat sink 16 to the baseboard 22. A fastener, such as rivet 94, has a collet which is mounted to extend beneath each of the four mounting ears 46 of the processor support bracket 18. The collet has a lowermost end which is slotted, such that the collet is expansible. Then, the processor support bracket 18 is aligned above the baseboard 22, with mounting ears 46 disposed above the mounting holes 32 holes 32. The collets of the fasteners 94 (two shown) are then pushed downward through the mounting holes, until the lower surfaces of the mounting ears 46 are flush with the top planar surface 24 of the baseboard 22. The collets of the fasteners 94 will extend through the holes 32, and beneath the lower surface 26 of the baseboard 22. The lower surface 26 of the baseboard 22 is preferably aligned adjacent to recesses formed into the exterior profiles of the exterior of the collets.

Then, pins of the fasteners 94 are pushed downward and into respective ones of the collets to expand the collets and latch the lock pins within the collets, with the collets expanded into gripping engagement with the baseboard 22 to rigidly secure the mounting ears 46 to the baseboard 22. After the mounting ears 46 are rigidly secured to the baseboard 22, such that the processor support bracket 18 is rigidly secured to the baseboard 22, a heat sink support bracket 20 is preferably secured to the baseboard 22.

The side edges of the single edge contact cartridge package 14 have a trapezoidal cross-section along an exterior periphery thereof defined in part by the side edges 35, when viewed in a horizontal plane. The side edges 35 are perfectly aligned with corresponding portions of the interior profiles 80 of the channel sections 38 to properly align the single edge contact cartridge package 14 with the support bracket 18, the slot connector 30 and the baseboard 22. The profiles 80 of the channels 38 extend to define surfaces for engaging a mating profile on the end-edges 35 of the single edge contact cartridge package 14 to properly align the single edge contact cartridge package 14 within the processor support bracket 18. The slot 40 of the connecting member 42 of the processor support bracket 18 is aligned with a protuberance 44. The protuberance 44 extends outward from the slot connector 30 for fitting within the slot 78 to properly align the processor support bracket 18 with the slot connector 30. The slot 40 will then extend around the slot connector 30 such that the slot connector 30 will fit flush against the planar upper surface 24 of the baseboard 22. After the single edge contact cartridge package 14 is inserted within the processor support bracket 18, the latches 36 are engaged with the channel sections 38 to latch the processor cartridge package 14 to the processor support bracket 18. Then, a mounting bar 54 is secured to the base 48 of the slot 79 of the heat sink support bracket 20 such that it engages within a slot 79 of the heat sink 16 to supportingly secure the heat sink 16 to the baseboard 22.

Figure 7:
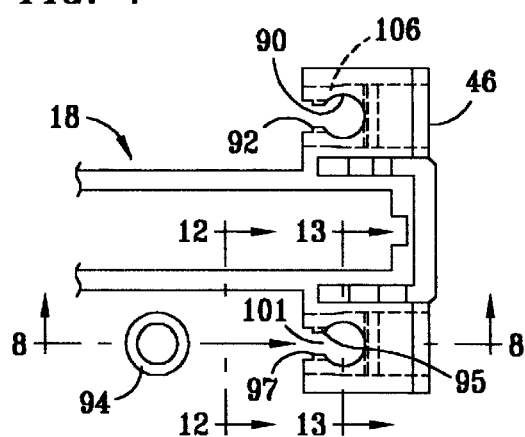
FIG. 7 illustrates a partial top view of a processor support bracket and a one-piece plastic fastener being inserted through slot and into a mounting hole of a mounting ear of the processor support bracket.

Referring now to FIG. 7, there is illustrated a partial top view of a processor support bracket 18 and a one-piece plastic fastener 94. The processor support bracket 18 includes four mounting ears 46 (two shown). Mounting apertures 90 extend vertically into respective ones of each of the mounting ears 88. Slots 92 extend through the sides of the mounting ears 46 and into the mounting apertures 90, such that the one-piece plastic fasteners 94 may be passed through the slots 92 and into respective ones of the mounting apertures 90 of the mounting ears 88. The width of the slots 92 are sized with a slight interference fit with at least one of the outside diameter of a main body of the collet section 96 and the pin 98 of the fastener 94 (shown in FIG. 8), such that the fastener 94 will snap into the mounting apertures 90 when passed through the slots 92.

Figure 8:
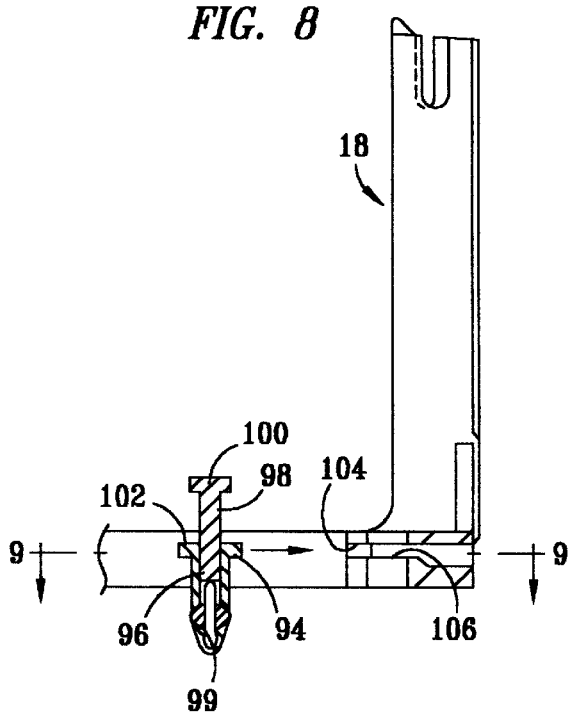
FIG. 8 illustrates a partial section view of the processor support bracket and the one-piece plastic fastener, taken along section line 8—8 of FIG. 7.

Referring now to FIG. 8, there is illustrated a partial sectional view of the processor support bracket 18, taken along section line 8—8 of FIG. 7. The one-piece plastic fastener 94 is depicted as including the main body collet section 96 and a pin 98. The collet section 96 has slots 99 extending into the lower portion such that the collet section can reduce in diameter when passed through a mounting hole 32 in a baseboard 22, and then the outer diameter of the collect section 96 will enlarge to an expanded state when the pin 98 is pressed downward within the collet section 96. A head 100 provides a stop for the pin 98. The upper end of the collet section 96 has a stop ring 102, which is integrally molded into the body of the collet section 96. A suitable one-piece plastic fastener, which may be used in place of the fastener 94, is a MICRO-TUFLOK brand, one-piece fastener Number D30-0156-01, available from ITW Fastex, of Des Plains, Ill. As shown in FIG. 8, the one-piece plastic fastener 94 is being inserted into in the mounting ear 46 of the processor support bracket 18. The stop ring 102 of the collet section 96 will fit against the bottom surface of an upper shelf, or ledge, provided by a shoulder 104 and the upper surface of a lower shelf, or ledge, provided by a shoulder 106, which are integrally molded as part of the mounting ears 46, preferably in flush mating engagements with the upper shelf of the shoulder 104 and the lower shelf of the shoulder 106.

Figure 9:
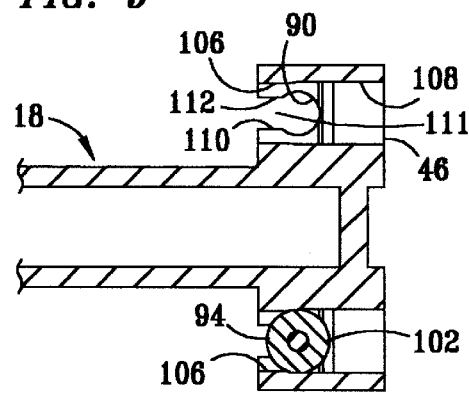
FIG. 9 illustrates a partial section view of the processor support bracket and the one-piece plastic fastener, taken along section line 9—9 of FIG. 8, after the one-piece plastic fastener has been inserted into in the mounting ear of the processor support bracket.

Referring now to FIG. 9, there is illustrated a partial section view of the processor support bracket 18, taken along section line 9—9 of FIG. 8. The one-piece plastic fastener 94 has been inserted into the aperture 90 of the mounting ear 46, such that stop ring 102 preferably fits flush against the surface of the upper ledge of the shoulder 104 and the lower ledge of the shoulder 106. An intermediate slot portion 108 extends through the main body portion of the mounting ear 46 for passing the stop ring 102 of the one-piece plastic fastener 94. The intermediate slot portion 108 includes an inner shoulder 105 and an outer shoulder 107, which provide a narrowing section of the intermediate slot portion 108. The narrowing section defined to extend between the inner and outer shoulders 112 of each of the slots 108 is sized to provide an interference fit with the outer diameter of the stop ring 102, such that the stop ring 102 will snap into place within the mounting aperture 90. The interference fit between the shoulders 105 and 107 will then retain the stop ring 102 within the intermediate slot portion 108, and thus the one-piece plastic fastener 94 within the mounting aperture 90.

Figure 10:
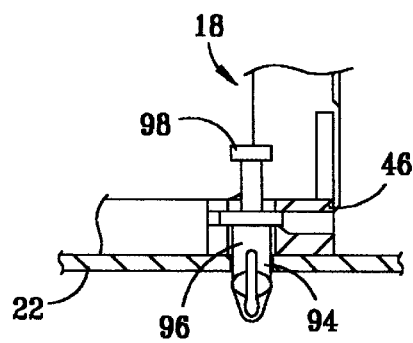
FIG. 10 illustrates a partial section view of the processor support bracket and the baseboard, taken along section line 8—8 of FIG. 7, and depicts the one-piece plastic fastener after being mounted in the mounting ear and passed through the baseboard, and shows the pin of the one-piece plastic fastener disposed in an upward position.

Referring now to FIG. 10, there is illustrated a partial section view of the processor support bracket 18 and the one-piece plastic fastener 94, taken along section line 8—8 of FIG. 7, after the one-piece plastic fastener 94 has been mounted to the mounting ear 46. The pin 98 of the fastener 94 is disposed in the upward position, such that the lower portion of the collet section 96 will collapse so that the collet section 96 may be passed through a mounting hole in the baseboard 22.

Figure 11:
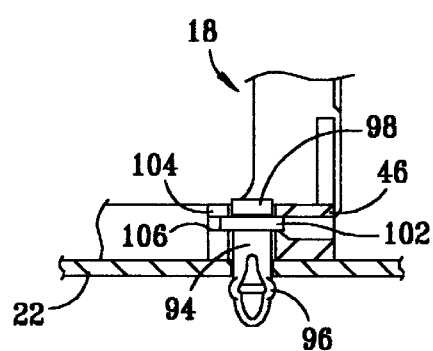
FIG. 11 illustrates a partial section view of the processor support bracket, a baseboard and the one-piece plastic fastener, taken along section line 8—8 of FIG. 7, after the pin of the one-piece plastic fastener has been driven downward to expand a lower portion of the collet section of the one-piece plastic fastener to secure the mounting ear of the processor support bracket to the baseboard.

Referring now to FIG. 11, there is illustrated a partial section view of the processor support bracket 18 and the one-piece plastic fastener 94, taken along section line 8—8 of FIG. 7, after the pin 98 has been pushed downward into the collet section 96. The collet section 96 is thus expanded, such that the fastener 94 will rigidly secure the mounting ear 46 and the support bracket 18 to the baseboard 22. Pushing the pin 98 downward within the collet section 96 causes expansion of the collet section 96 within the mounting hole 32 through the baseboard 22, and then further pushing of pin 98 downward wedges the pin 98 within the collet section 96.

Figure 12:
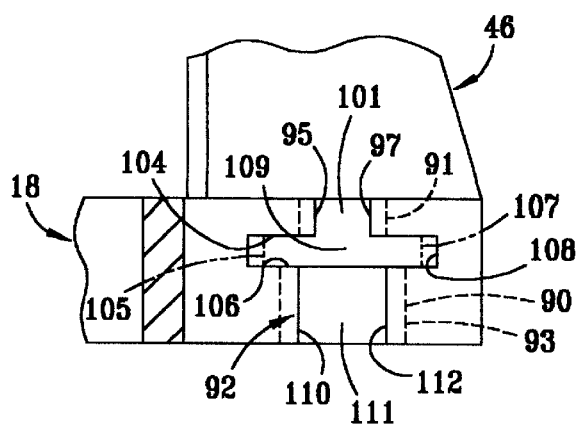
FIG. 12 illustrates a partial section view of the mounting bracket, taken along section line 12—12 of FIG. 7, such that an elevation view of the mounting ear and a slot into the side of the mounting ear are shown.

Referring now to FIG. 12, there is illustrated a partial section view of the mounting bracket 18 of FIG. 7, taken along section line 12—12, such that an elevation view of the mounting ear 46 and the slot 92 are shown. The slot 92 preferably has a periphery, or profile, having portions 91, 93 and 108 which are of various widths for passing various portions of the fastener 94 (shown in FIG. 8) into the vertical aperture 90. The upper portion 91 of the slot 92 has a smaller diameter than the lower portion 93 and the intermediate portion 108. The upper portion 91 of the slot 92 is sized for receiving the shank portion of the pin 98 of the fastener 94 (shown in FIG. 8). The lower portion 93 of the profile of the slot 92 is larger than the upper portion 91, and smaller than the intermediate portion 108. The lower portion 93 is sized for receiving the collet portion 96 of the fastener 94. The intermediate portion 108 has a diameter for receiving the stop ring 102 of the fastener 94, and is sized relative to the vertical aperture 90, the upper portion 91 and the lower portion 93 to define the upper ledge provided by the shoulder 104 and the lower ledge shoulder provided by the shoulder 106. The slot 92 may also be described as two slots which intersect and have longitudinal lengths that are transverse to one another. The first of the two slots being a vertical slot, that is a slot which has a longitudinal length that extends in a vertical direction, and which comprises the upper portion 91 and the lower portion 93. The second of the two slots would then be a horizontal slot, that is, a slot which has a longitudinal length that extends in a horizontal direction, and which comprises the intermediate portion 108.

Referring to FIGS. 7 and 12, the upper portion 91 of the slot 92 has a profile which provides a shoulder 95 and a shoulder 97 which are spaced apart by a gap 101. The shoulders 95 and 97 provide two spaced apart tabs which define the gap 101. The gap 101 is sized such that the shank of the pin 98 (shown in FIG. 8) will pass through the gap 101 between the shoulders 95 and 97, and may optionally be sized to have a slight interference fit with the shank of the pin 98, wherein the gap 101 is not substantially smaller than the diameter of the shank of the pin 98, such that the shank of the pin 98 will pass through the gap 101 when a nominal force is applied. Preferably, the gap 101 is sized such that is substantially smaller than the head 100 of the pin 98 (shown in FIG. 8), such that the pin 98 will not pass through the gap 101 without damaging the mounting ear 46 or the fastener 94. Then, after the pin 98 of the fastener 94 is pushed downward into the collet 96 of the fastener 94, to the position shown in FIG. 11, the head 100 cannot pass through the gap 101 and the fastener 94 will thus be retained within the aperture 90 such that it cannot be removed from the mounting ear 46 without first lifting the pin 98 upward from within the collet 96 and into an upward position shown in FIG. 8.

Referring now to FIGS. 9 and 12, the intermediate portion 108 of the slot 92 preferably extends through the mounting ear 46 with a width which is substantially the same spacing through the mounting ear 46. The shoulders 105 and 107 may be provided in the outward end of the intermediate portion 108 to define a spacing 109 which is smaller, yet not substantially smaller, than the outer diameter of the stop ring 102 of the fastener 94, to provide an interference fit such that stop ring 102 will pass into the slot 92, and may be removed from within the slot 92, with the application of a nominal force. This will hold the fastener 94 in place within the mounting ear 46 during assembly to a baseboard. Similarly, the lower portion 93 of the slot 92 is sized for receiving the collet portion 96 of the fastener 94. Preferably, the shoulders 110 and 112 are spaced apart by a gap 111, which is slightly smaller than the outer diameter of the collet 96 of the fastener 94, yet not substantially smaller, to provide a slight interference fit with the outer diameter of the collet portion 96, such that the collet portion 96 may pass through the gap with the application of a nominal amount of force. This interference fit will retain the fastener 94 within the aperture 90 of the mounting ear 46 during assembly of the mounting bracket 18 to the baseboard 22.

Referring to FIGS. 11 and 12, the gaps 101 and 111, which are provided by the spacing between the respective ones of the shoulders 95 and 97, and the shoulders 110 and 112, and also the gap 109 of the intermediate portion 108 of the slot 92, together define the upper ledge shoulder 94 and the lower ledge shoulder 106. The spacing between the shoulder, or ledge, 104 and the shoulder, or ledge, 106 is preferably sized such that the shoulders 104 and 106 fit flush with opposite sides of the stop ring 102 of the fastener 94. Additionally, the spacing from the shoulder 106 to the bottom surface of the mounting ear 46 is sized such that the collet portion 96 of the fastener 94 is spaced a first predetermined distance beneath the mounting ear 46 to pass the fastener 94 a second predetermined distance through the baseboard 22, when the fastener 94 is disposed in the aperture 90 and mounting ear 46 is disposed flush with the baseboard 22.

Figure 13:
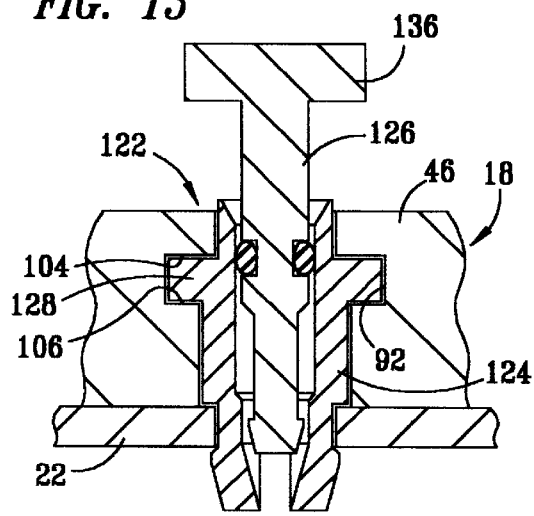
FIG. 13 illustrates a sectional view of the mounting ear of the processor support bracket and a fastener for securing the mounting ear to the baseboard, taken along section line 13—13 of FIG. 7.

Referring now to FIG. 13, there is illustrated a partial section view of mounting ear 46 of the processor support bracket 18 with a fastener 122, taken along section line 13—13 of FIG. 7. The fastener 122 includes a collet 124 and a pin 126. An annular-shaped rib 128 circumferentially extends to provide a protuberance which extends around a periphery of the collet 124. The annular-shaped rib 128 extends into the slot 92 such that the collet 124 is secured to the mounting ear 46 between the upper ledge 104 and the lower ledge 106. The pin 126 is preferably installed within the collet 124 in an upward position as shown in FIG. 13.

Figure 14:
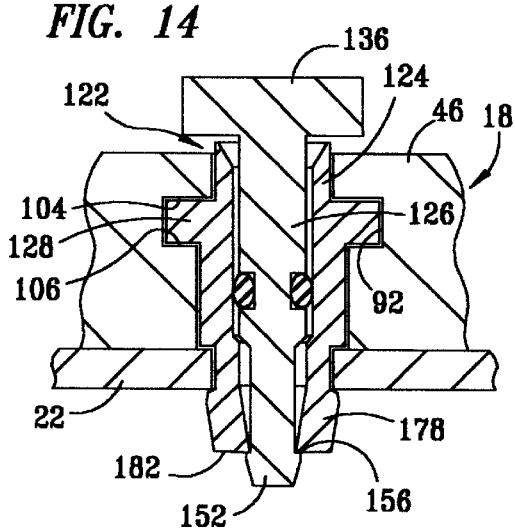
FIG. 14 illustrates a sectional view of the mounting ear and the fastener, taken along section line 13—13 of FIG. 7, after the mounting ear is fastened to the baseboard with the fastener by pushing a pin and a collet of the fastener from the position shown in FIG. 13 and into the position shown in FIG. 14.

Referring now to FIG. 14, there is illustrated a partial section view of the mounting ear 46 after being fastened to the baseboard 22, taken along section line 13—13 of FIG. 7. The pin 126 has been pushed downward from the position shown in FIG. 13 into the position shown in FIG. 14, such that the pin 126 locks the outermost portion of the collet 124 to the baseboard 22. Preferably, the processor support bracket 18 is formed of a thermoplastic material, such as polycarbonate, and the fastener 122 is formed of brass.

Figure 15:
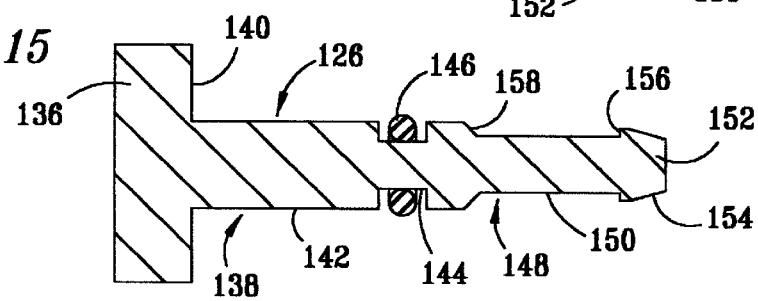
FIG. 15 illustrates a longitudinal section view of a pin of the fastener of FIGS. 13 and 14.

Referring now to FIG. 15, there is illustrated a longitudinal section view of the pin 126. The pin 126 is preferably a solid member which includes a head 136 and a shank 138. The lowermost portion of the head 136 defines a flat shoulder 140 which extends preferably perpendicular to a central, longitudinal axis of the shank 138. The shank 138 includes an upper section 142, which has an annular groove 144 that extends circumferentially into the periphery of a lowermost portion of the upper section 142. An O-ring 146 is disposed within the groove 144. When the pin 126 is disposed interiorly within the collet 124, the O-ring 146 is squeezed between the pin 126 and the collet 124, and provides a frictional engagement between the collet 124 and the pin 126, which results in a predetermined amount of force being required to overcome the frictional engagement and move the pin 126 within the collet 124. The shank 138 further includes a lower profile 148. The lower profile 148 has a smaller, or recessed, exterior diameter section defined by an elongated groove 150, and a lowermost portion which defines a head 152. The exterior periphery 154 of the head 152 is tapered such that it decreases in circumference in a direction of a lowermost end thereof, and the upper facing, top portion of the head 152 has a flat shoulder 156. Additionally, there is a taper 158 at the interface between the lower profile 148 and the upper section 142. The upper section 142 has a larger diameter than the lower profile 148.

Figure 16:
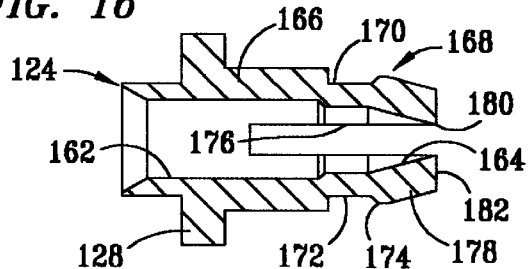
FIG. 16 illustrates a longitudinal section view of the collet of the fastener of FIGS. 13 and 14.

Referring now to FIG. 16, there is illustrated a longitudinal section view of the collet 124. The collet 124 is preferably formed as a singular member, molded of a thermoplastic material. The collet 124 has an interior passage 162 which extends therethrough, with the lowermost end of the interior passage 162 defining a tapered bore 164. The collet 124 also includes an upper head 166 and a lower tubular shank 168. A protuberance extends exteriorly of the collet 124, transverse to a longitudinal length of the collet 124, to define the annular-shaped rib 128. The tubular shank 168 has an exterior profile 170 which includes an annular, elongated recess 172 and a lower head 174. Two slots 176 extend into the tubular shank 168, perpendicular to one another, to define four collet fingers 178. The interior portion of the lowermost end of the collet fingers 178 and the tapered bore 164 of the lowermost portion of the interior passage 162 define four clasp end tips 180. The downward facing ends of the collet fingers 178 define flat end surfaces 182.

Referring again to FIGS. 13 and 14, the pin 126 is initially installed within the interior passage of the collet 124, with the O-ring 146 in the groove 144 and squeezed between the shank 138 of the pin 126 and the bore defining the interior passage 162 of the collet 124. The amount of squeeze on the O-ring 146 determines an internal pressure within the O-ring 146 which provides a frictional, gripping engagement between shank 138 of the pin 126 and the interior passage 162 of the collet 124. With the pin 126 disposed in the upward position within the collet 124 depicted in FIG. 13, the collet fingers 178 will flex inward for passage into and through a mounting hole of the baseboard 22, with the enlarged upper portion 142 of the shank 138 disposed above the tapered bore 164 of the interior passage 162. Then, once the lower head 174 of the collet 124 is inserted through the mounting hole in the baseboard 22, the pin 126 is stroked downward such that the lower head 152 of the pin 126 is disposed beneath the flat end tips 182 of the collet fingers 178. The clasp end tips 180 of the collet fingers 178 will then extend into the elongated groove 150 of the lower profile 148 of the pin 126, and the flat shoulder 156 of the lower head 152 of the pin 126 will engage in a flush alignment with the flat surface 182 of the lowermost end tips of the collet fingers 178. Thus, the pin 126 is snapped into a locking engagement within the collet 124, with the fastener 122 securely fastening the mounting ear 46 of the processor support bracket 18 to the baseboard 22.

Figure 17:
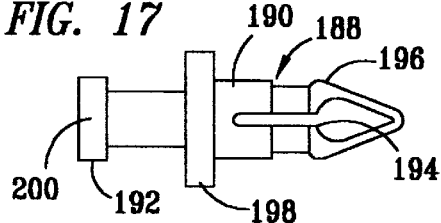
FIG. 17 illustrates a side view of a rivet having a main body, a pin, and an annular-shaped rib formed to exteriorly extend from an intermediate portion of the main body of the rivet.

Referring now to FIG. 17, there is illustrated a side view of a rivet 188 having a main body 190 and a pin 192. Two slots 194 extend into opposite sides of the main body 190. The main body 190 has a lower portion 196 which defines a lower head. The lower portion 196 is enlarged by moving the pin 192 downward within the main body 190, such that the lower portion 196 is expanded to secure the main body 190 within a hole passing through a baseboard. The main body 190 has an upper portion which defines an upper protuberance that provides an annular-shaped rib 198. The annular-shaped rib 198 will fit within one of the slots 92 of the mounting ear 46 to secure the mounting ear 46 to a baseboard. A stop 200 is provided at the top of the pin 192.

Figure 18:
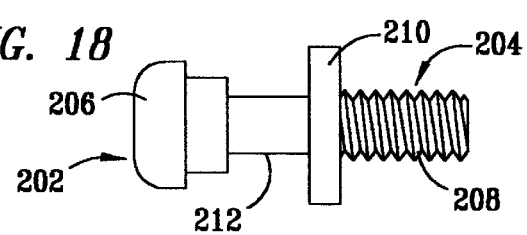
FIGS. 18 and 19 illustrate a side view and a left side view, respectively, of a fastener having a solid, singular body having a shank and a head, with the exterior lower portion of the shank being threaded and an annular-shaped rib formed to exteriorly extend from an intermediate portion of the shank.
Figure 19:
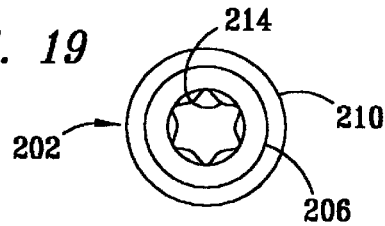

Referring now to FIGS. 18 and 19, there is illustrated a side view and a left-side view, respectively, of a fastener 202 having a solid, singular body, preferably formed of metal. The fastener 202 has a shank 204 and a head 206. A lower portion 208 of the shank 204 is threaded. A protuberance extends exteriorly of the fastener 202, transverse to a longitudinal length of the fastener 202, to define an annular-shaped rib 210 an intermediate portion of the shank 204. An upper portion 212 of the shank 204 is adjacent to the head 206. A hole is formed into the top of the head 206 with a profile 214 for nonrotatably engaging with a driving tool. Preferably, the annular-shaped rib 210 will extend within a slot 92 and between the upper ledge 104 and the lower ledge 106 of the mounting ear 46 to secure the mounting ear 46 to a baseboard, utilizing nuts or a threaded fastener to engage the lower threaded end 208 of the shank 204.

Figure 20:
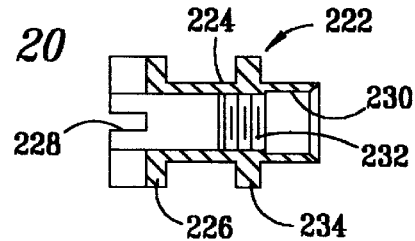
FIGS. 20 and 21 illustrate a longitudinal section view and a left side view, respectively, of a fastener which is formed as a single member having a shank and a head, the shank having a threaded bore extending therethrough and an annular-shaped rib formed to exteriorly extend from an intermediate portion of the shank.
Figure 21:
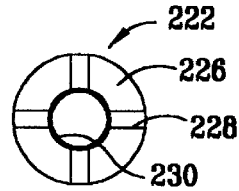

Referring now to FIGS. 20 and 21, there is illustrated a longitudinal section view and a left-side view, respectively, of a fastener 222. The fastener 222 is formed as a single member having a shank 224 and a head 226. The head 226 has slots 228 for engaging the head 226 of the fastener 222 with a driving tool, such as a standard screwdriver. A bore 230 extends within the shank 224, and has internal threads 232. A protuberance extends exteriorly of the fastener 222, transverse to a longitudinal length of the fastener 222, to define an annular-shaped rib 234 which exteriorly extends about an intermediate portion of the shank 224. The annular-shaped rib 234 will engage within the slot 92 of the mounting ears 46, between the upper ledge 104 and the lower ledge 106, to secure the mounting ear 46 to a baseboard 22. The fastener 222 is secured to the baseboard by engaging a threaded bolt or screw within the threads 232 of the bore 230.

Referring now to FIG. 22, there is illustrated a vertical section view of the baseboard 22 and a mounting adapter 240 after the mounting adapter 240 has been mounted to the baseboard 22. The mounting adapter 240 includes a bridge section 242 and two studs 244. The mounting adapter 240 will be placed on the under side of the baseboard 22 to secure the mounting ears 46 of the mounting bracket 18 to the baseboard 22. The studs 244 each include an upper portion 246, an intermediate portion 248 and a lower portion 250. The upper portion 246 of the stud 244 is threaded. The intermediate portion 248 of the threaded stud 244 is knurled. The lower portion of the stud 244 is enlarged to provided a spacer 250. The spacer 250 is provided for spacing the bridge member 242 beneath the baseboard 22, such that the baseboard 22 will not be contacted by the bridge portion 242. The studs 244 extend upward through the baseboard 22, with the threaded upper portion 246 of the studs 244 extending above the upper surface 24 of the baseboard 22. The studs 244 will be extended upwards through holes in the baseboards and then engaged by the fasteners 222 to secure a mounting ear 46 to the baseboard 222. The knurled section 248 is positioned within the baseboard 22, and is sized such that it provides an interference fit with a mounting hole 252 extending through the baseboard 22. The spacers 250 have an upper side which preferably fits flush against the outer, or lower, surface 26 of the baseboard 22 such that it spaces apart the bridge portion 242 from the lower surface 26 of the baseboard 22. The studs 244 extend upwardly from the baseboard 22, spaced apart such that they are aligned with the mounting ears 46 of the processor support bracket 18. The fastening nuts 222 (shown in FIGS. 20 and 21) are provided for threadingly engaging the upper threaded portion 246 of the studs 244.

Referring now to FIG. 23, there is illustrated a top view of a mounting adapter 240. The bridge section 242 of the mounting adapter 240 interconnects between two threaded studs 244.

Referring now to FIG. 24, there is illustrated a top view of a lower base 264 of a mounting bracket 262. The base 264 defines a mounting section for securing to the baseboard 22 and the processor cartridge package 14. The base 264 of the mounting bracket 262 is molded as a single, preferably of a thermal plastic material. The lower end of the base 264 has two mounting ears 46 on the opposite sides of the base 264, which have vertical apertures 90 extending therethrough. Extending from the inside portions of the mounting apertures 90 in outward directions are two slots 92. A latch member 266 extends rearward from a central portion of the base 264, with an outer portion of the latch member 266 providing a lever for pushing downward to push the latch member 266 to move outward in a rearward direction into an open position, rather than a latched position. The slots 92 extend in parallel, from the forward end of the base 264 and into respective ones of the two mounting apertures 90.

Referring now to FIG. 25, there is illustrated a front view of the base 264 of the mounting bracket 262. The base 264 has an upper channel member 268 which extends upward from the mounting ears 46. Two latch holes 270 extend in a horizontal direction, into the upper channel member 268 transverse to the longitudinal length of the channel member 268. Two pivot holes 272 also extend into opposite sides of the upwardly extending channel member 268, spaced downward and in parallel alignment with the latch holes 270, and spaced above the mounting ears 46. The channel member 268 has a channel region 274 and extends with a longitudinal length that is transverse to the major plane of a baseboard to which it is mounted. Two gussets 276 extend between the channel member 268 and the mounting ears 46, and are integrally molded with the upwardly extending channel member 268 and the mounting ears 46. The upwardly extending channel member 268 also has a narrow lower region 275. The slot 92 has a narrow region 278, an intermediately disposed, wide region 280, and a narrow region 282. Shoulders between the narrow region 278 and the region 280 define a downwardly facing, upper ledge 104. The shoulders between the region 280 and the narrow region 282 define an upwardly facing, lower ledge 106. The width of the region 282 is preferably defined to provide an interference fit with a fastener inserted therein, and thus includes the shoulders 95, 97, 110 and 112, and the respective gaps 101 and 111 (shown in FIGS. 7 through 12), such that an interference fit is provided with a fastener inserted therein. The fasteners 122, 188, 202 and 222 may be used in the mounting ear 46 to secure the base 264 to a baseboard 27.

Referring now to FIG. 26, there is illustrated a right-side view of the base 264 of the mounting bracket 262. The lever portion of the latch 266 is shown extending outwardly, to the right side in FIG. 26, spaced apart from the channel member 268. The latch hole 270 has a square cross-section and the pivot hole 272 has a round cross-section. Two grooves 286 and 288 are formed to taper into respective ones of the latch hole 270 and the pivot hole 272. A horizontally extending groove 273 extends into the exterior of the outer portion of the upwardly extending channel member 268. The mounting ear 46 is shown to extend slightly forward of the channel member 268. The gusset 276 is shown extending from the rearward portion of the channel section 274 and the rearward portion of the mounting ear 46.

Referring now to FIG. 27, there is illustrated a bottom view of the base 264 of the mounting bracket 262. The base 264 has an alignment slot 78 disposed in the lower end of the base 264, adjacent to the end of the channel defined by the channel section 274. Grooves 290 extend in parallel into the bottom of the mounting ears 46, extending from the outward end portion of the base 264, to the forward or inward end of the base 264 and adjacent to mounting apertures 90 and the slots 92.

Referring now to FIG. 28, there is illustrated an elevational view of a rearward side, or an outward end, of the base 264 of the mounting bracket 262. Two holes 284 extend in horizontal directions through the base 264, in alignment with an upper portion of the slots 92.

Referring now to FIGS. 29 through 34, there is illustrated various sectional views of the base 264 of the mounting bracket 262, taken along the sectioning planes set forth in FIG. 25. The latch member 266 has a downwardly facing shoulder 267 (shown in FIG. 29).

Referring now to FIG. 35, there is illustrated a top view of an upper member 292 of the mounting bracket 262, which defines a mounting section for mounting to the baseboard 22 and securing to the cartridge package 14, such that a longitudinal length of the upper member 292 extends transverse to the surface 24 of the baseboard 22. The upper member 292 includes an upper latch portion 294 which extends between the upper portions of two side portions 296 and 298. The two side portions 296 and 298, together with a vertically extending rearward portion 302, define a channel member 300. Tabs 303 extend inwardly into the section 300.

Referring now to FIG. 36, there is illustrated a frontal, elevation view of the upper member 292 of the mounting bracket 262. Two rectangular-shaped latch holes 294 and 295 extend transversely through the rearward portion 302. The lower portion of the sides 296 and 298 are spaced further apart than the upper end of the side portions 296 and 298 to define arms 308 and 310, respectively. The rearward portion 302 of the channel member 300 does not extend adjacent to the arms 308 and 310. Pivot tabs 312 and latch tabs 314 extend from the arms 308 and 310, transversely between the arms 308 and 310, such that the tabs 312 and 314 are spaced apart to extend in an inwardly direction relative to the channel section 300. The pivot tabs 312 and the latch tabs 314 are spaced apart in alignment for engaging within the pivot holes 272 and the latch holes 270, respectively, of the base 264.

Referring now to FIGS. 37, 38 and 39, there is illustrated a side view, a bottom view and a rear view, respectively, of the upper member 292 of the mounting bracket 262. The lower, outward end portion of the sides 296 and 298 each have a cut-out portions which define an arcuately shaped profile 315. A protuberance provides a latch tab 316 which extends inward from the back portion 302, from the top sides 296 and 298. Various other features of the upper member 292 of the mounting bracket 262 are shown.

Referring now to FIGS. 40 through 44, there is illustrated various sectional views of the upper member 292 of the mounting bracket 262, taken along the sectioning planes set forth in FIG. 36. The protuberance 316 is shown to extend inwardly from a forward, or inward, portion of the sides 296 of the downwardly facing shoulder 317. The pivot tab 312 has a profile 330 which defines a cylinder. The latch tab 314 has a profile 318 defining a horizontal, upwardly facing surface 320 and a tapered surface 322. The latch tab 324 has a tapered profile for engaging in the groove 273 of the base 264.

Figure 45:
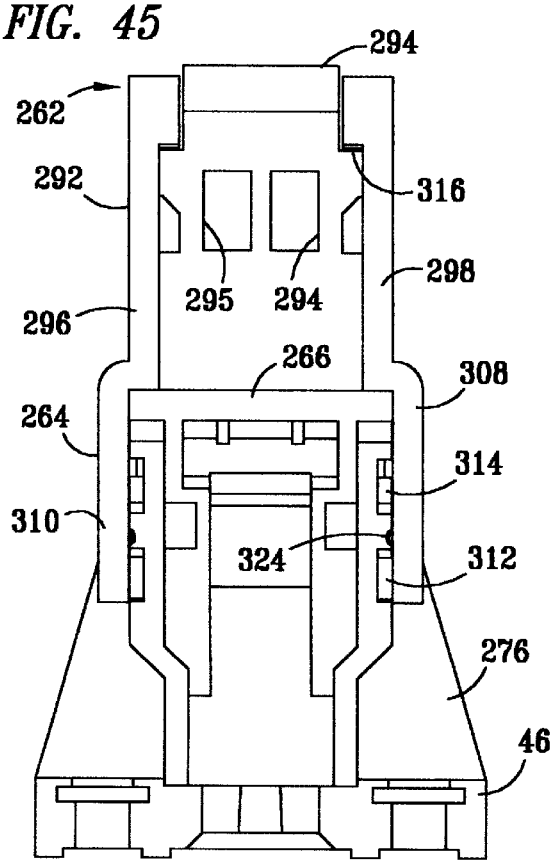
FIG. 45 illustrates a frontal elevation view of the mounting bracket after the upper member has been assembled to the base.

Referring now to FIG. 45, there is illustrated a frontal elevation view of the mounting bracket 262 after the upper member 292 has been assembled to the base 264, by inserting the pivot tab 312 (shown in FIG. 36) into pivot holes 272 (shown in FIG. 25). The upper member 292 is shown disposed in an upright position mounted to the base 264. Latch tabs 314 (shown in FIG. 36) are engaged within latch holes 270 (shown in FIG. 25), and the latch tabs 324 (shown in FIG. 25) are disposed in the outer grooves 273 (shown in FIG. 36) to latch the upper member 292 in the upright position relative to the base 264.

Figure 46:
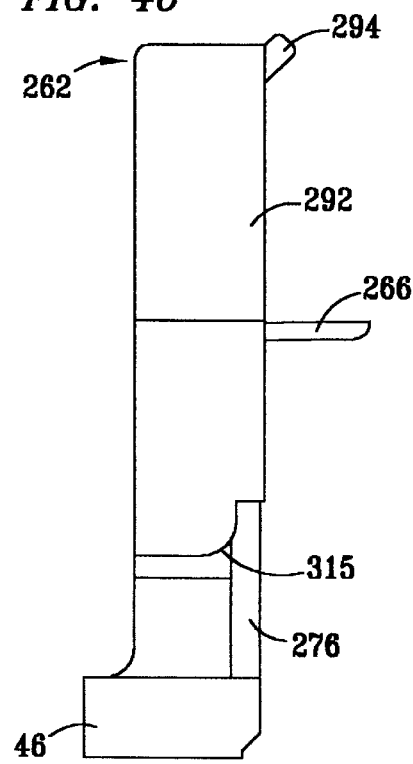
FIG. 46 illustrates a right-side elevation view of the mounting bracket with the upper member mounted to the base and angularly disposed in an upright position relative to the base.

Referring now to FIG. 46, there is illustrated a right-side elevation view of the mounting bracket 262 with the upper member 292 mounted to the base 264 and disposed in an upright position. The latch member 294 is shown extending outward and to the side of the mounting bracket 262.

Figure 47:
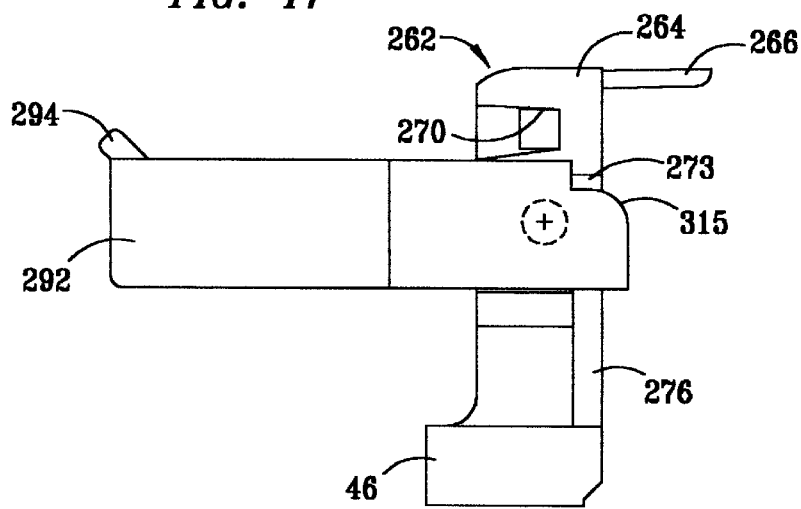
FIG. 47 illustrates a right-side elevation view of the mounting bracket after latch tabs thereof are removed from respective ones of the latch holes formed into the base.

Referring now to FIG. 47, there is illustrated a right-side elevation view of the mounting bracket 262, after the latch tab 314 and the latch tabs 324 (shown in FIG. 36) are removed from respective ones of the latch holes 270 and the grooves 273 (shown in FIG. 25), and then the upper member 292 is pivoted relative to the base 264 to dispose the upper member 292 in a downward angular position. This provides a lower profile relative to the height above a baseboard 22 to which the mounting bracket 262 is secured, such that a larger number of baseboards 22 having the mounting brackets 262 assembled thereto may be stacked and then stored in a shipping container of a fixed size. The arcuate shaped cut-out profile portion 315 is provided in the lower, outward corners of the upper section 292 to provide clearance between the lowermost end of the outward sides of the upper member 292 and the gussets 276 of the base 264.

Various types of single edge processor cartridge packages may be secured using the mounting bracket 262, some using only the base 264 and others using both the base 264 and the upper member 292. Processor packages may be secured in the channel portion of the bracket 262 by engaging the tabs 316, engaging within the holes 294 or 295, or engaging the upper member 292. Processor packages may also be secured to a baseboard with the shoulder 267 of the latch member 266, using the base 264 without using the upper member 292.

Figure 48:
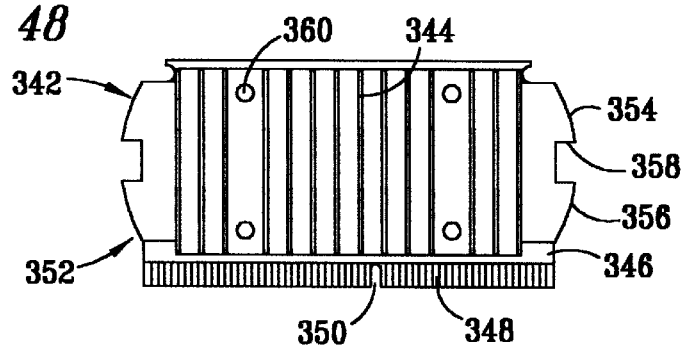
FIG. 48 illustrates an elevation view of a processor cartridge package having a finned heat sink mounted to a processor board.

Referring now to FIG. 48, there is illustrated an elevation view of a processor cartridge package 342, having a heat sink 344. The heat sink 344 preferably has a finned surface on one side. The heat sink 344 is mounted to a processor board 346. The processor board 346 has edge contacts 348. A spacer slot 350 extends into the edge of processor board 346 between a portion of the edge contacts 348. The spacer slot 350 is aligned with the key member 72 of the slot connector 30 (shown in FIGS. 2 and 3) when the processor board is mounted to connect to the slot connector 30. The heat sink 344 has an edge profile 352 with an upper arcuately shaped portion 354 and a lower arcuately shaped portion 356. A notch 358 is formed intermediate between the upper and lower arcuately shaped portions 354 and 356. The notch 358 preferably has a rectangular-shaped profile that defines shoulders for engaging with the latch portion 266 of the base 264 (shown in FIG. 29). The heat sink 344 is fastened to the processor board 346 by rivets 360.

Figure 49:
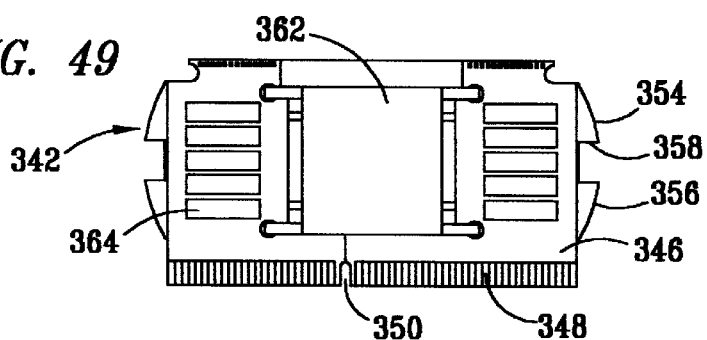
FIG. 49 illustrates an elevation view of the processor cartridge package, taken from an opposite side of the cartridge package than that of FIG. 48.

Referring now to FIG. 49, there is illustrated an elevation view of the processor cartridge 342, taken from an opposite side of the cartridge than the view of FIG. 48.

Figure 50:
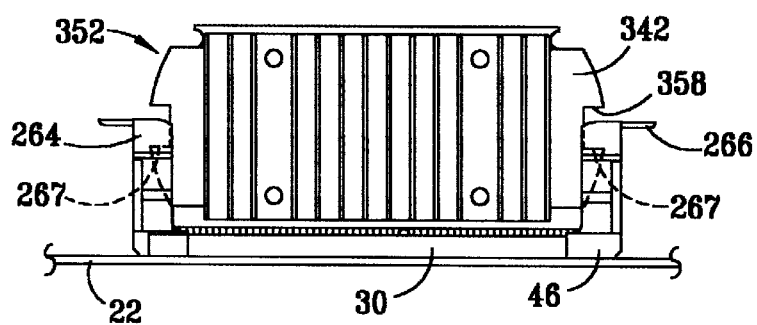
FIG. 50 illustrates an elevation view of the processor cartridge after being mounted to a baseboard using two of the bases of the mounting bracket.

Referring now to FIG. 50, there is illustrated an elevation view of the processor cartridge 342 after being mounted to a baseboard 22 using the base 264. An upwardly facing shoulder defined by a lower side of the notch 358 into the heat sink side profile 352 is engaged by the downwardly facing shoulder 267 of the latch member 266 to secure the processor cartridge 342 to the slot connector 30.

Figure 51:
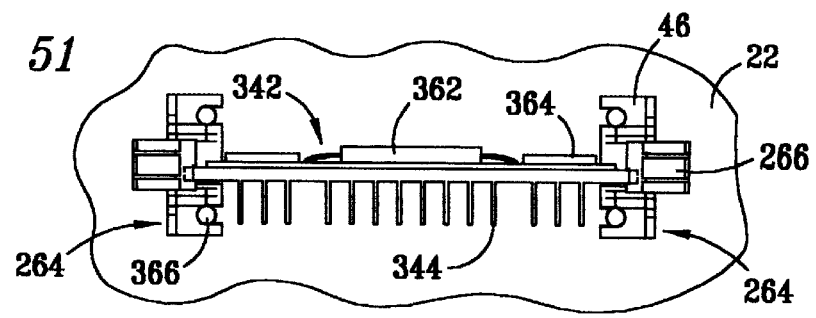
FIG. 51 illustrates a top view of the processor cartridge after having been mounted to a baseboard using two of the bases of the mounting bracket.

Referring now to FIG. 51, there is illustrated a top view of the processor cartridge 342 after having been mounted to a baseboard 222 using two of the bases 264 of the mounting bracket 262. The mounting bases 264 are mounted to the baseboard 222 by four fasteners 366, which secure the mounting ears 46 to the baseboard 22. Preferably, the fasteners 366 are provided by fasteners such as those shown in FIGS. 13 through 21.

Figure 52:
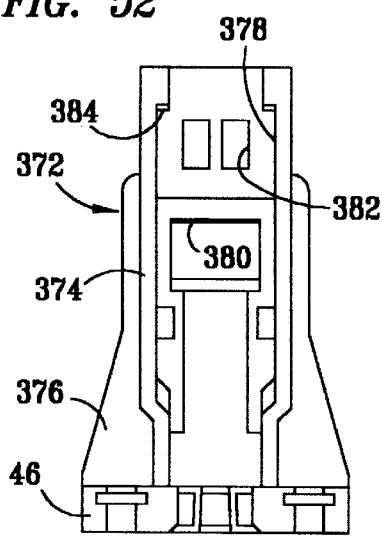
FIG. 52 illustrates an elevation view of a mounting bracket.

Referring now to FIG. 52, there is illustrated an elevation view of mounting bracket 372 having two mounting ears 46 on a lower end thereof. The mounting bracket 372 defines a mounting section which is mounted to the baseboard such that a longitudinal length of the mounting bracket 372 extends transverse to the surface 24 of the baseboard 22, and to which the cartridge package 14 is secured. The mounting ears 46 preferably have the fastener set forth above in FIGS. 7 through 12, and may be secured to a baseboard using the fasteners 122, 188, 202 and 222 of FIGS. 13 through 21. The mounting bracket 372 has an upwardly extending channel section 374, which defines a channel region 378. Gussets 376 extend between the mounting ears 46 and the channel section 374. The mounting bracket 372 may be utilized to mount various types of single edge cartridge packages to a baseboard. One style is the single edge cartridge package 342 shown in FIGS. 49 and 50. The latch holes 382 and 384 are provided for mounting the contact cartridge package 14 of the type shown in FIG. 1. Bracket 372 has the same engagement surfaces for latching a single edge contact cartridge package to a baseboard as that shown for the mounting bracket 262 in FIG. 45, except that the mounting bracket 372 does not have an upper portion that may be pivoted relative to a base, such as the upper member 292 and the lower base 264 in FIGS. 45 through 47. The entire mounting bracket 372 is molded as a single, integral piece, preferably of a thermoplastic material.

Figure 53:
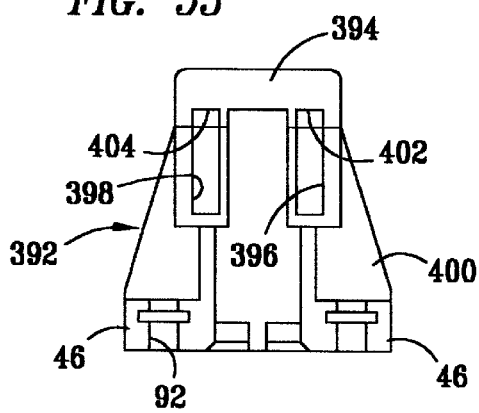
FIG. 53 illustrates an elevation view of an alternative mounting bracket.

Referring now to FIG. 53, there is illustrated an alternative mounting bracket 392. The mounting bracket 392 has a mounting foot, or mounting ear, 46 included on a lower end thereof. The mounting bracket 392 defines a mounting section which is mounted to the baseboard 22 such that a longitudinal length of the mounting bracket 392 extends transverse to the surface 24 of the baseboard 22, and to which the cartridge package 14 is secured. The mounting bracket 392 has a tab or latch portion 394 of a profile of a single edge contact cartridge package, such as cartridge package 342, one of the slots 396 and 398 depending upon the orientation of the bracket 392 relative to the baseboard 222 and the processor cartridge package 342, depending on which side it is used. The mounting bracket 392 has two mounting ears 46 arranged as that shown in FIGS. 7 through 12, which may be used with the fasteners 122, 188, 204, and 222 of FIGS. 13 through 21. Gussets 400 extend on opposite sides of the mounting bracket 392. The slot 396 and 394 have upwardly disposed, downwardly facing shoulders 404 and 402 respectively.

Figure 54:
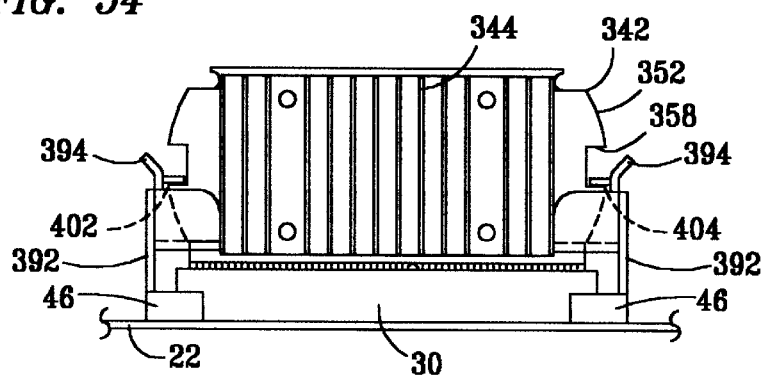
FIGS. 54 and 55 illustrate a side elevation view and a top view, respectively, of a single edge contact cartridge package mounted to a baseboard with two of the mounting brackets of FIG. 53.
Figure 55:
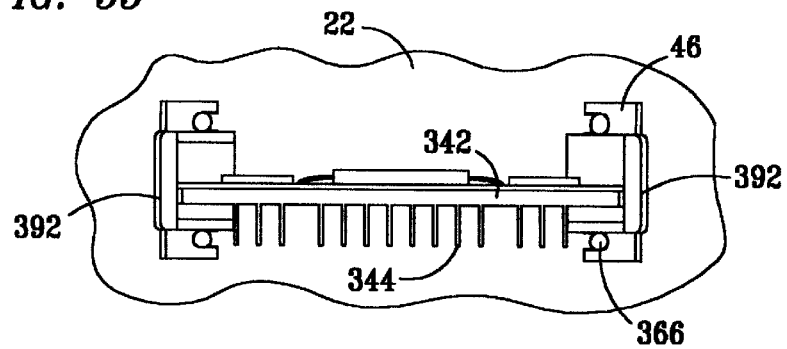

Referring now to FIGS. 54 and 55, there is illustrated a side elevation view and a top view, respectively, of a single edge contact cartridge package 342 mounted to a baseboard 222. The two mounting brackets 392 are disposed in an inwardly facing alignment, such that the pairs of slots 396 and 398 of the different ones of the brackets 392 face toward one another, and are spaced apart on opposite sides of the slot connector 30. One side of the mounting brackets 392 has a shoulder 402 which engages an upwardly facing portion of the notch 358 of the single edge contact cartridge package 342. The other side of the cartridge package 342 has an upwardly facing shoulder defined by the second notch 358 which is engaged by the shoulder 404 of the second one of the mounting brackets 293.

Referring now to FIG. 56, there is illustrated a partial top view of a processor support bracket 422 having four mounting ears 424 (two shown) which each include a mounting hole 426 for receiving a one-piece plastic fastener 446 to mount the processor support bracket 422 to a baseboard 22.

Referring now to FIG. 57, there is illustrated a enlarged view of one of the mounting ears 424 of the processor support bracket 422 of FIG. 56. The mounting hole 426 has an upper bore 428 which extends downward from the top of the mounting hole 426, and four vertical grooves 430, 432, 434 and 436 which extend from the bottom of the mounting hole 426 upwards to clasp tips 438. A lower bore 440 extends concentrically with the upper bore 428. A horizontal shoulder 442 is defined by the upper bore 428 and the lower bore 440.

Referring now to FIG. 58, there is illustrated a partial section view of the mounting ear 424 of the processor support bracket 422 of, taken along section line 58—58 of FIG. 57. The lower bore 440 extends upwards to the horizontal shoulder 442. The grooves 430, 432, 434 and 436 (shown in FIG. 57) extend upward to the bottom of the clasp tips 438. The clasp tips 438 extend radially inward from the vertical surface of the upper bore 428 and into the mounting hole 426. The lower facing surfaces of the four clasp tips 438 are horizontally extending, planar surfaces. The upper surfaces of the four clasp tips 438 are tapered to extend radially inward toward the center of the upper bore 428, in a downward direction.

Referring now to FIG. 59, there is illustrated a sectional view of the mounting ear 424 of the processor support bracket 422, taken along section line 58—58 of FIG. 57, and a side view of a one-piece plastic fastener 446 which is being inserted within the mounting hole 426 of the mounting ear 424. The fastener 446 may be of the type described above for the one-piece plastic fasteners shown in FIGS. 15 through 21. The one-piece plastic fastener 446 includes a pin 448, an expansible collet section 450 and a stop ring 452. The expansible collet section 450 is slotted to allow it to collapse for passing through the mounting hole 426 and through a mounting hole of a baseboard 22. The stop shoulder 452 will fit flush with the shoulder 442, and will also fit flush underneath the bottom of the clasp tips 438. The terminal ends of the clasp tips 438 will flex inward was the stop ring 452 of the one-piece plastic fastener 446 is inserted into the upper bore 428, and then are resilient to flex outward above the top of the stop ring 452 to secure the fastener 446 within the mounting hole 426 of the mounting ear 424, as shown in FIG. 52.

Referring now to FIG. 60, there is illustrated a sectional view of the mounting ear 424 of the processor support bracket 422, taken along section line 58—58 of FIG. 57. The one-piece plastic fastener 446 has been inserted within the mounting hole 426 of the mounting ear 424, until the stop shoulder 452 is within the upper bore 428 and flush with the shoulder 442. The collet section 450 of the fastener 446 will then extend downward through the lower bore 440 and from the lower end of the mounting ear 424. The lower, horizontally extending planar surfaces of the four clasp tips 438 will extend above and fit flush with the top surface of the stop ring 452 to latch the fastener 446 within the mounting hole 426. The pin 448 is disposed in the upper position, such that the collet section of the fastener 446 may be inserted through a mounting hole in a baseboard.

Referring now to FIG. 61, there is illustrated a sectional view of the mounting ear 424 the processor support bracket 422, taken along section line 59—59, of FIG. 57, after the stop pin 448 has been pushed downward to wedge the collect section 450 of the one-piece plastic fastener 446 outward beneath a baseboard 22. Thus, the mounting ear 424 of the support bracket 422 will be rigidly secured to the baseboard 22. The stop pin 448 will wedge within the collet section 450, such that it is securely fastened therein.

Referring now to FIGS. 62 and 63, there are illustrated partial, section views of a mounting ear 456 of a processor support bracket 458 and a fastening assembly 462. Preferably, the processor support bracket 458 and the fastening assembly 462 are formed entirely of a thermoplastic material, such as polycarbonate, including the stop pin 466. The fastening assembly 462 includes a collet 464 which is integrally molded, to become a unitary structure with the mounting ear 456 of the processor support bracket 458. A pin 466 is shown after being installed within the collet 464 of the mounting ear 456 of the processor support bracket 458. Pin 466 is shown disposed in the upward position shown in FIG. 62, such that the collet 464 may be inserted through a baseboard 22. Once the collet 464 is inserted through the baseboard 22, the pin 466 is pushed downward within the collet 464 from the upward position shown in FIG. 62 to a downward, locking position depicted in FIG. 63. Then, the collet 464 may not be removed from passing through the mounting hole 468 of the baseboard 22, and will rigidly secure the processor support bracket 458 to the baseboard 22.

Referring now to FIG. 64, there is illustrated a side view of the pin 466. The pin 466 has a head 470 and a shank 472. A flat 474 extends between the lowermost end of the head 470, adjacent to the shank 472, and perpendicular to a longitudinal central axis of the shank 472. The shank 472 has an upper section 476 and a lower profile 478. The upper section 476 of the shank 472 is preferably of a uniform circumferential size. The lower profile 478 has an annular-shaped recess 480 on an upper portion thereof, an intermediate portion which defines a stop ring 482, and a lower portion with an annular-shaped recess 484. The recess 484 in the lower portion of the shank 472 defines a lower head 486. The lowermost surface of the stop ring 482 has a taper 488, and the lowermost surface of the lower head 486 has a taper 490. The tapers 488 and 490 allow the shank 472 of the pin 466 to be pushed downward within the collet 464, from the position shown in FIG. 62 to the position shown in FIG. 63. The upper surface of the stop ring 482 defines a flat 492, and the upper surface of the lower head 486 defines a flat 494. The flats 492 and 494 engage flats within the collet 464 to latch the pin 466 within the collet 464 in the position shown in FIG. 63.

Referring now to FIG. 65, there is illustrated a sectional view of the mounting ear 456, with the collet portion 464 thereof extending downward. Four slots 502 extend into the collet 464 to define four collet fingers 504. The collet 464 has an interior passage 506 which has a profile with an the enlarged portion which defines a recess 508 that extends in an upper portion thereof, and a lower, tapered portion 510 extends therebelow. The lowermost surfaces 512 of the collet fingers 504 are flat, or planar surfaces.

Referring now to FIG. 66, there is illustrated a bottom view of the mounting ear 456, and the integrally molded collet 464 formed therein. The four slots 502 are shown extending into the collet 464 to define the four collet fingers 504.

Referring now to FIGS. 62 and 63, as the pin 466 is pushed downward within the collet 464 from the position shown in FIG. 62 to the position shown in FIG. 63, the lower head 486 of the pin 466 will move from within the recess 508 of the profile of the interior passage 506 of the collet 464, downward along the tapered surfaces 510. The taper 490 engages the tapered portion 510 to urge the collet fingers 504 outward into an expanded position. Then, when the lower head 486 is pushed beneath the recess 508 and between the collet fingers 504, the stop ring 482 will pass into the interior passage recess 508 in the position shown in FIG. 63, such that the flat 492 on the upper end of the stop ring 482 will engage against an upper flat surface 512 of the recess 508 of the passage 506 to lock the pin 466 within the collet 464, with the collet fingers 504 locked into an expanded position. In an expanded position, the collet fingers 504 are pressed outward against the baseboard 22, such that the collet 464 may not be removed from the baseboard 22, rigidly mounting the mounting ear 46 to the baseboard 22.

Figure 67:
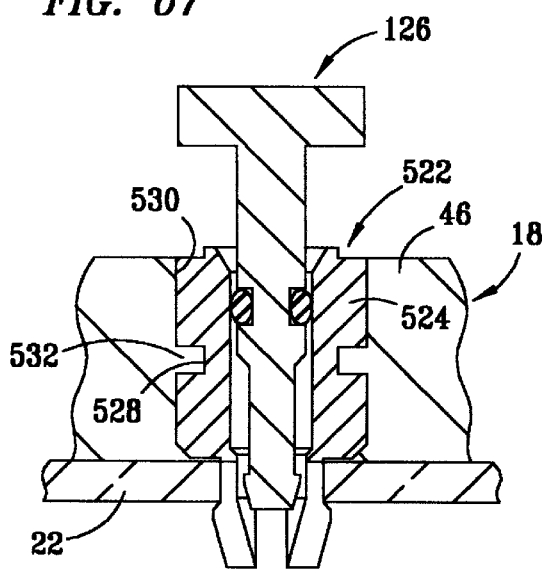
FIGS. 67 and 68 illustrate sectional views of a mounting ear and a fastening assembly of a processor support bracket shown in released and latched positions, respectively.

Referring now to FIG. 67, there is illustrated a sectional view of mounting ear 46 of the processor support bracket 18 with a fastening assembly 522. The fastening assembly 522 includes a collet 524 and a pin 126. The pin 126 is shown in FIG. 15 and described above. An annular groove 528 circumferentially extends around a periphery of the collet 524 and into the periphery of the collet 524. The collet 524 preferably has an outside diameter of approximately one-quarter (0.250) inches, and has been mounted within a hole 530, with an interference fit of approximately fifty thousandths (0.050) inches. The collet 524 is sonic welded using the collet 524 as an energy generator. Friction between the collet 524 and the mounting hole 530 causes thermal energy to be transferred to the thermal plastic material of the mounting ear 46 disposed proximate to the perimeter of the hole 530, causing the material to flow into the groove 528 and define in an annular protuberance 532. The annular protuberance 532 extends into the groove 528 such that the collet 524 is secured to the mounting ear 46. The pin 126 is preferably installed within the collet 524 in an upward position as shown in FIG. 67.

Figure 68:
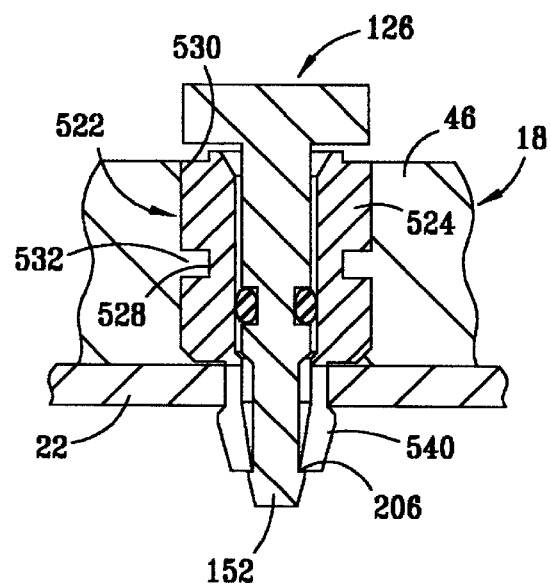

Referring now to FIG. 68, there is illustrated a sectional view at the mounting ear 46. The mounting ear 46 is fastened to the baseboard 22 by pushing the pin 126 downward from the position shown in FIG. 67 into the position shown in FIG. 68, in which the pin 126 locks the outermost portion of the collet 524 to the baseboard 22. Preferably, the processor support bracket 18 is formed of a thermoplastic material, such as polycarbonate, and the fastening assembly 522 is formed of brass.

Figure 69:
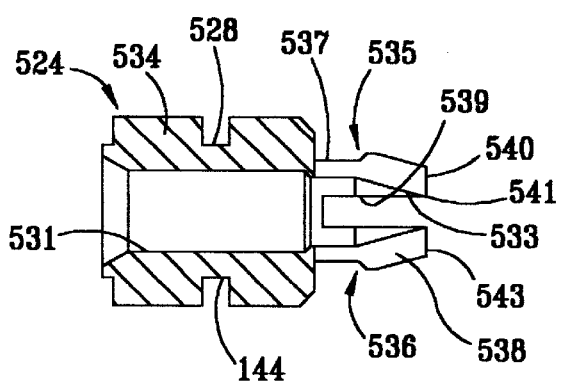
FIG. 69 illustrates a longitudinal section view of the collet.

Referring now to FIG. 69, there is illustrated a longitudinal section view of the collet 524. The collet 524 has an interior passage 531 which extends therethrough, with the lowermost end of the interior passage 531 defining a tapered bore 533. The collet 524 also includes an upper head 534 and a lower tubular shank 535. The tubular shank 535 has an exterior profile 536 which includes an annular, elongated recess 537 and a lower head 538. Two slots 539 extend into the tubular shank 535, perpendicular to one another, to define four collet fingers 540. The interior portion of the lowermost end of the collet fingers 540 and the tapered bore 533 of the lowermost portion of the interior passage 531 define four clasp end tips 541. The downward facing ends of the collet fingers 540 define flat end surfaces 543.

Figure 70:
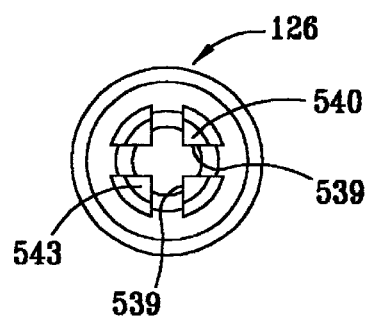
FIG. 70 illustrates a bottom view of the collet.

Referring now to FIG. 70, there is illustrated a bottom view of the collet 524. The two slots 539 extend perpendicular to one another, and into the lowermost portion of the collet 524 to define the four collet fingers 540.

Referring now to FIGS. 15, 66 and 67, the pin 126 is initially installed within the interior passage of the collet 524, with the O-ring 146 in the groove 144 and squeezed between the shank 138 of the pin 126 and the bore defining the interior passage 531 of the collet 524. The amount of squeeze on the O-ring 146 determines an internal pressure within the O-ring 146 which provides a frictional, gripping engagement between shank 138 of the pin 126 and the interior passage 531 of the collet 524. With the pin 126 disposed in the upward position within the collet 524 depicted in FIG. 67, the head 538 of the shank 138 is disposed above the tapered bore 533 of the interior passage 531 of the collets 524, and the collet fingers 540 will flex inward for passage into and through a mounting hole of the baseboard 22. Then, once the lower head 538 of the collet 524 is inserted through the mounting hole in the baseboard 22, the pin 126 is stroked downward to the position shown in FIG. 68, such that the lower head 152 of the pin 126 is disposed beneath the flat end surfaces 543 of the collet fingers 540. The clasp end tips 541 of the collet fingers 540 will then extend into the annular shaped recess 150 of the lower profile 148, and the flat shoulder 156 of the lower head 152 of the pin 126 will engage in a flush alignment with the flat surfaces 543 of the lowermost end tips of the collet fingers 540. Thus, the pin 126 is snapped into a locking engagement within the collet 524, with the fastening assembly 522 securely fastening the mounting ear 46 of the processor support bracket 18 to the baseboard 22.

Referring now to FIGS. 71 and 72, there is illustrated sectional views of a mounting ear 46 of the processor support bracket 18 which is secured to the baseboard 22 with a fastening assembly 542. The fastening assembly 542 includes a collet 544 and a pin 546 which engages interiorly within the collet 544. The pin 546 is pushed downward within the collet 544, from the position shown in FIG. 71 to the position shown in FIG. 72, to lock the mounting ear 46 to the baseboard 22. The collet 544 has an annular groove 548 which extends circumferentially into the periphery of the collet 544. The periphery of the collet 544 fits within a hole 550 in the mounting ear 46 with an interference fit of approximately fifty thousandths (0.050) inches. The collet 544 preferably has an exterior diameter of one-quarter (0.250) inches. The collet 544 is utilized as an energy generator to transfer thermal energy to the portion of the thermal plastic material of the mounting ear 46 which is disposed along the perimeter of the hole 550 such that an annular protuberance 552 is formed to circumferentially extend into the groove 548 formed in the exterior periphery of the collet 544. This sonically welds the collet 544 within the mounting ear 46. Preferably, the processor support bracket 18 is formed of a thermoplastic material, such as polycarbonate, and the fastening assembly 542 is formed of brass.

Referring now to FIG. 73, there is illustrated a side view of the pin 546. The pin 546 has a head 556 and a shank 558. A flat shoulder 560 extends on the lowermost portion of the head 556, perpendicular to the center line of the shank 558. The pin 546 is a solid member. The shank 558 has an upper section 562, an intermediate section 564 and a lower section 566. The upper section 562 has an intermediate diameter, which is of a size which is smaller than the diameter of the head 556 and smaller than the diameter of the intermediate section 564. The intermediate section 564 has an enlarged diameter in relation to the size of the diameter of the upper section 562 and the lower section 566 of the shank 558. The intermediate section 564 has the largest diameter of the shank 258. The lower section 566 includes an exterior recess 568 and a lowermost head 570. The recess 568 extends into the periphery of the lower section 566 of the shank 558, above the head 570. A flat 572 extends on the upper facing portion of the intermediate section 564 which extends adjacent to the lowermost portion of the upper section 562. The lowermost portion of the intermediate section 564 has a taper 574. The uppermost portion of the head 570 has a flat 576. The lowermost portion of the head 570 has a taper 578.

Referring now to FIG. 74, there is illustrated a sectional view of the collet 544. The collet 544 has an interior bore 582 of two diameters, the upper portion having a larger diameter than the lower portion, and the lowermost portion of the interior bore 582 having a tapered bore 584. The collet 544 has a head 586 and a tubular shank 588. The upper portion 590 of the head 586 has a smaller diameter and two longitudinal slots 592 which divide the upper portion 590 into four collet fingers 594. The four collet fingers 594 each have interiorly disposed clasp members 596, which extend radially into the interior passage provided by the bore 582. The tubular shank 588 of the collet 544 has an exterior profile which defines an exterior recess 598 and a head 600. The lowermost portion of the head 600 is tapered. Two slots 602 extend into the tubular shank 588 of the collet 544 to define four collet fingers 604. The four collet fingers 604 each have interiorly disposed clasp end tips 606 at the lowermost ends thereof. The lower facing surfaces 608 of the collet fingers 604 are planar surfaces. The recess 598 defines an annular-shaped shoulder 605 of the collet fingers 604. The shoulder 605 has a planar surface.

Referring now to FIG. 75, there is illustrated a side view of the lower side of the collet 544. The lower side of the collet 544 shows the two slots 602 which define the four collet fingers 604.

Referring now to FIG. 76, there is illustrated a top view of the collet 544. The slots 592 are shown extending into the upper portion 590 of the collet head 586 to define the collet fingers 594.

Referring again to FIG. 71, the pin 546 is shown in an upper position relative to the collet 544. The upper surface 572 of the pin 546 engages against the lower surface of the clasp members 596 of the upper collet finger 594, such that the pin 546 is retained within the collet 544. The head 570 of the shank 558 of the pin 546 is retained within the bore 582, disposed above the tapered lowermost portion of the bore 582 which is defined by the tapered bore 584. The collet fingers 604 may be pressed inward to be passed through a mounting hole in the baseboard 22. Then, pushing the pin 546 downward in the collet 544, from the position shown in FIG. 71 to the position shown in FIG. 72, causes the lower end 574 of the intermediate section 564 of the shank 558 of the pin 546 to advance downward and engage against the lowermost portion of the interior passage 582 which is disposed within the head 586 of the collet 544. The head 570 of the shank 558 of the pin 546 will then pass downward beneath the collet fingers 604. Then, the flat surface 576 of the upper portion of the head 570 of the shank 558 of the pin 546 will engage flush against the lowermost surfaces 608 of the collet fingers 604, such that the pin 546 is locked into the downward position within the collet 544 as shown in FIG. 72. Once the pin 546 is pushed downward in the collet 544 to the position shown in FIG. 72, the collet fingers 604 may no longer be pressed inward and remain in the outer position with the shoulders 605 of the collet fingers 604 engaged flush against the lowermost surface 26 of the baseboard 22, such that the collet 544 and the pin 546 may not be removed from within the baseboard 22. Thus, the mounting ear 46 of the processor support bracket 18 will be fastened to the baseboard 22.

The present invention has several advantages over prior art processor support bracket mounting fixtures. The present invention may be used to install a single edge contact cartridge package to a system baseboard from above the top surface of the baseboard, without requiring any tools or manipulation of the components disposed beneath the baseboard. A processor support bracket is provided for mounting to a system baseboard a single edge contact cartridge package, which contains a processor core and auxiliary processing devices. The processor support bracket includes a mounting foot provided by a mounting ear having a mounting slot with a profile for inserting a fastener therein such that the fastener is held in place during assembly and after assembly is fixedly secured within the mounting ear. The processor support bracket is mounted to the baseboard from above the baseboard, without requiring access to the lower side of the baseboard.

Although the preferred embodiment has been described in detail, it should be understood that various changes, substitutions and alterations can be made therein without departing from the spirit and scope of the invention as defined by the appended claims.

What is claimed is:

1. A processor support bracket for mounting a single edge contact cartridge package containing a processor to a system baseboard in a personal computer, with the single edge contact cartridge package in mating engagement with a slot connector mounted to the system baseboard, comprising in combination:

two channel sections disposed adjacent to opposite ends of the slot connector and extending upward from a first surface of the baseboard, said channel sections each having respective interior profiles which are shaped for matingly engaging edges of the single edge contact cartridge package in a particular alignment;

a latch mechanism mounted to one of said channel sections and the single edge contact cartridge package for interlocking the single edge contact cartridge package within the channel members when the edge connector of the single edge contact cartridge package is disposed in mating engagement with the slot connector;

a plurality of mounting ears extending from said channel sections, for fitting flush against the first surface of the baseboard, said mounting ears having an aperture for aligning with mounting holes in the baseboard and an intermediate slot portion which extends into a main body portion of said mounting ears, transverse to said aperture, to define an upper ledge and a lower ledge within respective ones of said mounting ears;

a plurality of collets mounted to respective ones of said mounting ears, said collets having respective upper ends which defines stops and lower slotted ends, said stops having thicknesses for fitting between said upper ledges and said lower ledges of a respective ones of said mounting ears when said slotted ends are disposed for extending downward within said apertures of said respective ones of said mounting ears such that said slotted ends of said collets are aligned for fitting through a corresponding ones of a plurality of mounting holes in said baseboard when said apertures of said respective ones of said mounting ears are aligned with said corresponding ones of the plurality of mounting holes in said baseboard, and said slotted ends defining surfaces having first profiles; and a plurality of pins, each having an exterior profile for moving downward within interior passages of corresponding ones of said collets and engaging respective ones of said first profiles defined by said slotted ends of said collets, to lock said slotted ends of said collets in expanded positions, such that said collets rigidly secure said mounting ears to said first surface of said baseboard.

2. The processor support bracket of claim 1, wherein said stops comprise annular shaped ring portions of said collets which circumferentially extend outward of said lower slotted ends of said collets prior to expansion of said lower slotted ends.

3. The processor support bracket of claim 1, wherein said intermediate slot portions of said mounting ears are open in respective directions which face adjacent ones of said mounting ears which are included on opposite ones of said channel sections.

4. The processor support bracket of claim 1, wherein said slots formed into said mounting ears each have a respective narrowing section defined between an inner shoulder and an outer shoulder, through which a corresponding one of said stops passes to snap into a position within a respective one of said apertures of said mounting ears.

5. The processor support bracket of claim 4, wherein said stop comprises an annular-shaped ring portion of said collet which circumferentially extends outward of said lower slotted end of said collet prior to expansion of said lower slotted end.

6. The processor support bracket of claim 5, wherein said intermediate slot portions of said mounting ears are open in respective directions which face adjacent ones of said mounting ears which are included on opposite ones of said channel sections.

7. A processor support bracket for mounting a processor cartridge package to a surface of a system baseboard of a personal computer, comprising:

a mounting section which extends transverse to the surface of the baseboard when mounted to the baseboard, such that a portion of the cartridge package which extends transverse to the baseboard when the cartridge package is mounted to the baseboard is disposed adjacent to said mounting section for securing the cartridge package to the mounting section;

an end of said mounting section disposed adjacent to the surface of the baseboard and having two spaced apart apertures which extend through a portion of said mounting section, transverse to the surface of the baseboard in alignment for disposing respective fasteners therein for securing the mounting section to the baseboard;

said end of said mounting section further having two slots formed therein, said slots extending transverse to said apertures and intersecting respective ones of said apertures, and said slots having a width for passing said fasteners through respective ones of said slots and into said apertures;

wherein said slots have respective profiles which define shoulders that extend transverse to respective ones of said apertures, with a respective pair of said shoulders spaced apart and facing in opposite directions adjacent to each of said apertures; and said fasteners having a protuberance which extends from a respective one of said fasteners and fits between a respective one of said pair of spaced apart shoulders, such that said respective fastener is retained from moving from said aperture in a direction which is transverse to said slot.

8. The processor support bracket of claim 7, wherein said protuberance defines an annular-shaped rib.

9. The processor support bracket of claim 8, wherein said annular-shaped rib fits flush with said pair of spaced apart shoulders.

10. The processor support bracket of claim 7, wherein said profiles of said slots further define respective pairs of retaining shoulders which extend transverse to the surface of the baseboard and having gaps therebetween to provide an interference fit for passing said fasteners therethrough and into respective ones of said apertures, and then retaining said fasteners in said apertures during assembly of said mounting section to the system baseboard.

11. The processor support bracket of claim 7, wherein said end of said mounting section further comprises two ears which extend substantially parallel to the surface of the baseboard, and through which respective ones of said apertures and said slots extend.

12. The processor support bracket of claim 7, further comprising:

said profiles of said slots further defining respective pairs of retaining shoulders which extend transverse to the surface of the baseboard and having gaps therebetween to provide an interference fit for passing said fasteners therethrough and into respective ones of said apertures, and then retaining said fasteners in said apertures during assembly of said mounting section to the system baseboard.

13. The processor support bracket of claim 12, further comprising:

said end of said mounting section having two ears which extend substantially parallel to the surface of the baseboard, and through which respective ones of said apertures and said slots extend.

14. A method for mounting a processor to a baseboard for a personal computer, comprising the steps of:

mounting a slot connector to the upper surface of the baseboard;

providing a plurality of mounting holes which are distally spaced apart adjacent to the slot connector;

providing two upwardly extending channel sections disposed adjacent to opposite ends of the slot connector, the two channel sections having a plurality of mounting ears extending from positions which are distally spaced, and providing each of the mounting ears with a corresponding one of a plurality of collets mounted thereto, with each of the collets having a slotted lower end which extends downward from a corresponding one of lower surfaces of the mounting ears;

providing exteriors of the collets with circumferentially extending grooves, which extend into respective ones of the exteriors of the collets for receiving protuberances of a thermal plastic material forming the mounting ears of the two channel sections;

placing the two channel sections upon the upper surface of the baseboard, such that lower surfaces of the mounting ears extend flush with the upper surface of the baseboard and the slotted lower ends of the collets extending through the mounting holes which are spaced apart adjacent to the slot connector, with the slot connector centrally disposed adjacent to the two channel sections;

vibrating the collets with a sonic welding attachment to transfer vibratory energy to the collets, which causes a transfer of thermal energy to the material of the mounting ears disposed proximate to the perimeter of a hole within which the collet extends such that the material will flow into the groove formed into the exterior of the collet to sonically weld the collet to the mounting ear of the processor support bracket;

pressing pins downward within the collets to expand the slotted lower ends of the collets such that upwardly facing, outwardly extending shoulders of the slotted lower ends of the collets are pressed outward to extend beneath a lower surface of the baseboard, fitting flush therewith, and locking the collets into engagement with the lower surface of the baseboard;

aligning oppositely facing edges of a single edge contact cartridge package with the two channel sections for aligning the single edge contact cartridge package for engaging within the two channel sections;

engaging the single edge contact cartridge package within the two channel sections, and the lowermost contact edge of said single edge contact cartridge package with electrical contacts of the slot connector; and latching the single edge contact cartridge package within the channel sections of the processor support bracket.

15. The method according to claim 14, further comprising the step of providing the lowermost ends of the collets with inwardly facing clasp end tips and lowermost flat planar surfaces for engaging within a recess within a profile of a shank of the pins to snap the clasp end tips of the collet fingers into the profile of the shank of the pin, which extends above an interlocking flat surface of the lowermost end of the collet with a flat upwardly facing surface of a shoulder extending outward from the recess of the profile of the shank of the pin to interlock the pin within the collet.

16. The method according to claim 14, further comprising the step of providing the upper end of the collet with interiorly disposed clasp members for engaging within a recess in the upper portion of the shank of the pin such that an intermediate portion of the shank of the pin having a diameter which is larger than the recess in the upper portion and the recess in the profile of the lower portion of the shank will be retained interiorly within a central passage of the collet.

17. A method for mounting a processor to a baseboard for a personal computer, comprising the steps of:

mounting a slot connector to the upper surface of the baseboard;

providing a plurality of mounting holes which are distally spaced apart adjacent to the slot connector;

mounting a heat sink base support bar to the baseboard;

providing a processor support bracket having a connecting member and two upwardly extending channel sections, with the connecting member extending between the two channel sections, and the processor support bracket further having a plurality of mounting ears extending from positions which are distally spaced about the processor support bracket, and providing each of the mounting ears with a corresponding one of a plurality of collets mounted thereto, with each of the collets having a slotted lower end which extends downward from a corresponding one of bottom planar surfaces of the mounting ears;

providing each of the collets with a respective exterior, circumferentially extending groove extending into corresponding ones of the outer bodies of the collets, each for receiving a protuberance of a thermo-plastic material forming the mounting ear of the processor support bracket;

vibrating the collets with a sonic welding attachment to transfer vibratory energy to the collets, which causes a transfer of thermal energy to the material of the mounting ears disposed proximate to the perimeter of a hole within which the collet extends such that the material will flow into the groove formed into the exterior of the collet to sonically weld the collet to the mounting ear of the processor support bracket;

placing the processor support bracket upon the upper surface of the baseboard, such that the lower surfaces of the four mounting ears extend flush with the first planar surface of the baseboard and the slotted lower ends of the collets extending through the mounting holes which are spaced apart adjacent to the slot connector, with the slot connector centrally disposed between the two channel sections;

pressing pins downward within respective ones of the collets to expand the slotted lower ends of the collets such that an upwardly facing, outwardly extending shoulders of the slotted lower ends of the collets are pressed outward to extend beneath the lower surface of the baseboard, fitting flush therewith, and locking the collet into engagement with the lowermost surface of the baseboard, and engaging a head of the shank of the pin beneath a flat lowermost facing surface of the collet finger, such that the pin is locked in engagement with the collet;

aligning oppositely facing edges of a single edge contact cartridge package such that the engaged matingly tapered surfaces of the channel sections of the processor support bracket for aligning the single edge contact cartridge package within the processor support bracket and engaging the side edges within the channel sections such that the single edge contact cartridge package is fully engaged within the processor support bracket, and the lowermost contact edge thereof engages within electrical contacts of the slot connector;

latching the single edge contact cartridge package within the channel sections of the processor support bracket; and mounting a mounting member within a slot of the heat sink to latch the heat sink to the base member of the heat sink support bracket.

18. The method according to claim 17, further comprising the step of providing the lowermost ends of the collets with inwardly facing clasp end tips and lowermost flat planar surfaces for engaging within a recess within a profile of a shank of the pins to snap the clasp end tips of the collet fingers into the profile of the shank of the pin, which extends above an interlocking flat surface of the lowermost end of the collet with a flat upwardly facing surface of a shoulder extending outward from the recess of the profile of the shank of the pin to interlock the pin within the collet.

19. The method according to claim 17, further comprising the step of providing the upper end of the collet with interiorly disposed clasp members for engaging within a recess in the upper portion of the shank of the pin such that an intermediate portion of the shank of the pin having a diameter which is larger than the recess in the upper portion and the recess in the profile of the lower portion of the shank will be retained interiorly within a central passage of the collet.

* * * * *